(12) United States Patent
Kang et al.

(10) Patent No.: US 9,773,983 B2
(45) Date of Patent: Sep. 26, 2017

(54) ORGANIC LIGHT EMITTING DIODE DEVICE

(71) Applicant: LG Display Co., Ltd., Seoul (KR)

(72) Inventors: Hyeseung Kang, Seoul (KR); Taeil Kum, Paju-si (KR); Youngkwan Jung, Daegu (KR); Hyungjune Kim, Paju-si (KR); Jungsoo Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 236 days.

(21) Appl. No.: 14/731,289

(22) Filed: Jun. 4, 2015

(65) Prior Publication Data

US 2016/0104844 A1 Apr. 14, 2016

(30) Foreign Application Priority Data

Oct. 13, 2014 (KR) .......................... 10-2014-0137952

(51) Int. Cl.
*B32B 9/00* (2006.01)
*H01L 51/00* (2006.01)
*H01L 51/50* (2006.01)

(52) U.S. Cl.
CPC ........ *H01L 51/0067* (2013.01); *H01L 51/006* (2013.01); *H01L 51/0054* (2013.01); *H01L 51/0058* (2013.01); *H01L 51/0061* (2013.01); *H01L 51/0072* (2013.01); *H01L 51/0073* (2013.01); *H01L 51/504* (2013.01); *H01L 51/5044* (2013.01); *H01L 51/5008* (2013.01);
(Continued)

(58) Field of Classification Search
CPC ............... H01L 51/0067; H01L 51/504; H01L 51/0054; H01L 51/0058; H01L 51/0072; H01L 51/0073; H01L 51/006; H01L 51/0061; H01L 51/5008; H01L 51/5072; H01L 2251/558; H01L 2251/5384; C09K 11/06
USPC ........... 428/690; 257/40, 642, 759, E23.169
See application file for complete search history.

(56) References Cited

U.S. PATENT DOCUMENTS

| | | | |
|---|---|---|---|
| 2006/0232194 A1 | 10/2006 | Tung et al. | |
| 2007/0167626 A1 | 7/2007 | Kim et al. | |
| 2007/0278937 A1 | 12/2007 | Forrest et al. | |

(Continued)

FOREIGN PATENT DOCUMENTS

| | | |
|---|---|---|
| CN | 101461075 A | 6/2009 |
| CN | 103664748 A | 3/2014 |
| WO | WO 2012/070233 A1 | 5/2012 |

OTHER PUBLICATIONS

European Extended Search Report, European Application No. 15170961.5, dated Feb. 15, 2016, 7 pages.
(Continued)

*Primary Examiner* — Ruiyun Zhang
(74) *Attorney, Agent, or Firm* — Fenwick & West LLP

(57) ABSTRACT

An organic light emitting diode device is disclosed. There is an organic light emitting diode device that comprises a first light emitting part between an anode and a cathode, the first light emitting part including a first light emitting layer, a second light emitting part comprising a second light emitting layer on the first light emitting part, and a first charge generation layer between the first light emitting part and the second light emitting part, wherein the first charge generation layer comprises at least two hosts, and at least one of the at least two hosts includes a pyrene compound.

22 Claims, 9 Drawing Sheets

(52) U.S. Cl.
CPC .. *H01L 51/5072* (2013.01); *H01L 2251/5384* (2013.01); *H01L 2251/558* (2013.01)

(56) References Cited

U.S. PATENT DOCUMENTS

2013/0153867 A1* 6/2013 Seo .................... H01L 51/0054
257/40
2014/0061600 A1  3/2014 Kim et al.

OTHER PUBLICATIONS

Chinese First Office Action, Chinese Application No. 201510455519.3, dated Jan. 26, 2017, 15 pages.

* cited by examiner

ORGANIC LIGHT EMITTING DIODE DEVICE

This application claims the priority benefit of Korean Patent Application No. 10-2014-0137952 filed on Oct. 13, 2014, which is hereby incorporated by reference for all purposes as if fully set forth herein.

BACKGROUND

Field

This document relates to an organic light emitting diode device, and more particularly, to an organic light emitting diode device which can achieve high emission efficiency and low driving voltage.

Related Art

Image display devices used for displaying a variety of information on a screen are one of the core technologies of the information and communication era. Such image display devices have been being developed to be thinner, lighter, and more portable, and furthermore to have high performance. With the development of the information society, various demands for display devices have been increasing. To meet these demands, research on flat panel displays such as liquid crystal displays (LCD), plasma display panels (PDP), electroluminescent displays (ELD), field emission displays (FED), organic light emitting diodes (OLED), etc has been actively conducted.

Among the flat panel displays, the OLED devices are a type of devices that emit light as electrons and holes are paired and extinguished, when a charge is injected into an organic light emitting layer formed between an anode and a cathode. The OLED devices are advantageous in that they may be formed on a flexible transparent substrate such as plastic, and are operable at relatively low voltage as compared to plasma display panels or inorganic EL displays, consume less power, and give good color balance. Especially, white OLED devices are used for various purposes in lighting, thin light sources, backlights for liquid crystal displays, or full-color displays using color filters.

In the development of white OLED devices, high efficiency, long lifetime, color purity, color stability against current and voltage variations, ease of manufacturing, etc. are important, so research and development are being done depending on which of these factors should be taken into account. White OLED device structures may be roughly classified into a single-layer emitting structure and a multi-layer emitting structure. Of these structures, a multilayer emitting structure having a blue fluorescent emitting layer and a yellow phosphorescent emitting layer stacked in tandem is mainly employed to realize white OLED devices with long lifetime.

Specifically, a phosphorescent emitting structure is used, which is a lamination of a first light emitting part using a blue fluorescent diode as a light emitting layer and a second light emitting part using a yellow phosphorescent diode as a light emitting layer. Such a white OLED device produces white light by mixing blue light emitted from the blue fluorescent diode and yellow light emitted from the yellow phosphorescent diode. In this case, a charge generation layer is formed between the first light emitting part and the second light emitting part to double the efficiency of current generated in the light emitting layers and facilitate charge distribution. The charge generation layer is a layer that generates a charge, i.e., electrons and holes in it, which can prevent a rise in driving voltage because it doubles the efficiency of current generated in the light emitting layers and facilitates charge distribution.

However, the currently used charge generation layer focuses on maximizing the injection of holes and electrons into each emitting layer, but with the limitation that the transfer of electrons from the charge generation layer to an electron transport layer is not smooth. Poor electron injection may result in poor balance between electrons and holes, causing a reduction in the efficiency of the light emitting layers and therefore a degradation of the device characteristics.

SUMMARY

An object of this document is to provide an organic light emitting diode device which can achieve high luminous efficiency and low driving voltage.

In one aspect, there is an organic light emitting diode device that comprises a first light emitting part between an anode and a cathode, the first light emitting part including a first light emitting layer, a second light emitting part comprising a second light emitting layer on the first light emitting part, and a first charge generation layer between the first light emitting part and the second light emitting part, wherein the first charge generation layer comprises at least two hosts, and at least one of the at least two hosts includes a compound indicated by the following Chemical Formula 1:

[Chemical Formula 1]

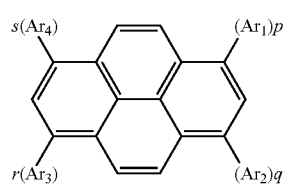

wherein each of p, q, r, and s is 0, 1 or an integer that satisfies $1 \leq p+q+r+s \leq 4$, and $Ar_1$, $Ar_2$, $Ar_3$, and $Ar_4$ are independently at least one among the following structures:

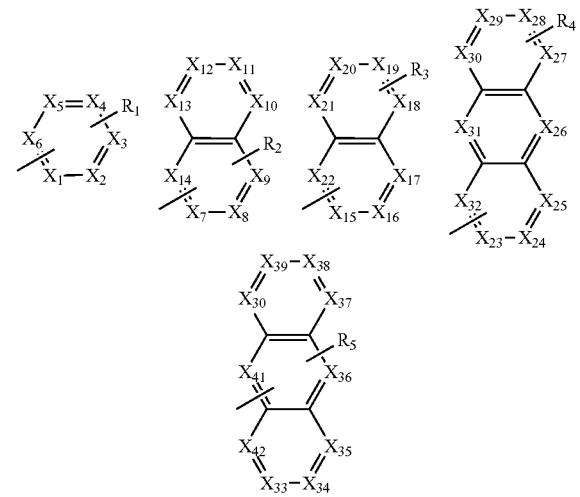

wherein at least one of $X_1$ to $X_6$, at least one of $X_7$ to $X_{14}$, at least one of $X_{15}$ to $X_{22}$, at least one of $X_{23}$ to $X_{32}$, and at least one of $X_{33}$ to $X_{42}$ comprise at least one among C, N, S, and O, and $R_1$, $R_2$, $R_3$, $R_4$, and $R_5$ are independently at least one among substituted or unsubstituted alkyl, aryl, hetero aryl, aromatic, hetero aromatic, aryl amine, and hetero aryl amine compounds.

In another aspect, there is an organic light emitting diode device that comprises at least two light emitting parts between an anode and a cathode, the at least two light emitting parts including a light emitting layer, and charge generation layers between the at least two light emitting parts, one of the charge generation layers comprising at least two hosts, and a dopant and the at least two hosts includes different energy levels, and one of the at least two hosts includes a compound that is bonded to the dopant.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
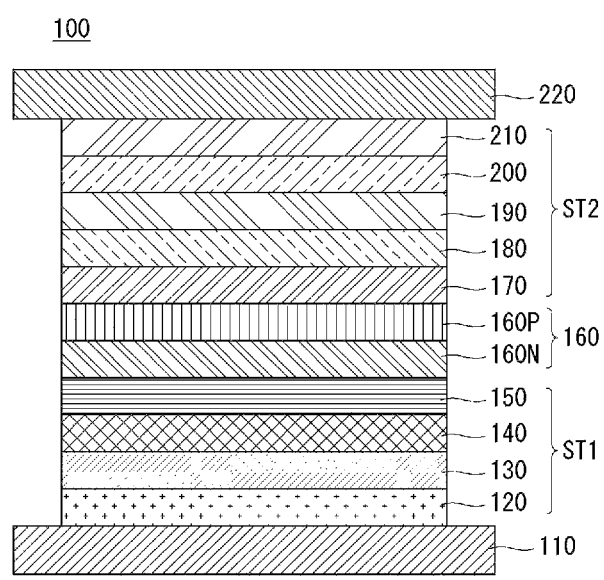
FIG. 1 is a view showing an organic light emitting diode device according to a first exemplary embodiment of the present invention.

The various aspects and features of the present invention and methods of accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims.

The shapes, sizes, percentages, angles, numbers, etc. shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention.

When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another either partly or wholly, and may technically interact or work together in various ways. The exemplary embodiments may be carried out independently or in combination with one another.

Hereinafter, various exemplary embodiments of the present invention will be described in detail with reference to the accompanying drawings.

FIG. 1 is a view showing an organic light emitting diode device according to a first exemplary embodiment of the present invention.

Referring to FIG. 1, an organic light emitting diode device 100 of this invention comprises light emitting parts ST1 and ST2 between an anode 110 and a cathode 220, and a charge generation layer 160 between the light emitting parts ST1 and ST2. The anode 110 is a hole injection electrode, and may be formed of ITO (indium tin oxide), IZO (indium zinc oxide), or ZnO (zinc oxide) having a high work function. Also, when the anode 110 is a reflective electrode, the anode 110 may further comprise a reflective layer formed of aluminum (Al), silver (Ag), or nickel (Ni) under a layer formed of ITO, IZO, or ZnO.

The first light emitting part ST1 forms a single light emitting diode, and comprises a first hole injection layer 120, a first hole transport layer 130, a blue light emitting layer 140, and a first electron transport layer 150. The blue light emitting layer 140 comprises at least one of a blue light emitting layer, a dark blue light emitting layer, and a sky blue light emitting layer.

The first hole injection layer 120 may function to facilitate the injection of holes from the anode 110 to the blue light emitting layer 140, and may be formed of, but not limited to, at least one among CuPc (copper phthalocyanine), PEDOT (poly(3,4)-ethylenedioxythiophene), PANI (polyaniline), and NPD(N,N'-bis(naphthalene-1-yl)-N,N'-bis(phenyl)-2,2'-dimethylbenzidine). A thickness of the first hole injection layer 120 may be 1 to 150 nm. When the thickness of the first hole injection layer 120 is 1 nm or greater, the hole injection characteristics may be improved, or when the thickness of the first hole injection layer 120 is 150 nm or less, an increase in the thickness of the first hole injection layer 120 may be prevented and a rise in driving voltage may be therefore prevented. The first hole injection layer 120 may not be included in the composition of the organic light emitting diode device, depending on the structure or characteristics of the device.

The first hole transport layer 130 may function to facilitate the transport of holes, and may be formed of, but not limited to, at least one among NPD (N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), spiro-TAD(2,2'7,7'-tetrakis(N,N-diphenylamino)-9,9'-spirofluorene), and MTDATA(4,4',4"-Tris(N-3-methylphenyl-N-phenylamino)-triphenylamine). A thickness of the first hole transport layer 130 may be 1 to 150 nm. When the thickness of the first hole transport layer 130 is 1 nm or greater, the hole transport characteristics may be improved, or when the thickness of the first hole transport layer 130 is 150 nm or less, an increase in the thickness of the first hole transport layer 130 may be prevented and a rise in driving voltage may be therefore prevented.

The blue light emitting layer 140 comprises at least one of a blue light emitting layer, a dark blue light emitting layer, a sky blue light emitting layer. The blue light emitting layer 140 may be formed of a phosphorescent material comprising a host material having CBP(4,4'-bis(carbazol-9-yl)biphenyl) Or mCP(1,3-bis(carbazol-9-yl)benzene) and a dopant material having (4,6-F$_2$ppy)2Irpic. Alternatively, the blue light emitting layer 140 may be formed of, but not limited to, a fluorescent material including at least one among spiro-DPVBi, spiro-6P, distyrylbenzene (DSB), distyrylarylene (DSA), a PFO polymer, and a PPV polymer.

The first electron transport layer 150 functions to facilitate the transport of electrons, and affects the lifetime or efficiency of the organic light emitting diode device. The first electron transport layer 150 may be formed of, but not limited to, at least one among Alq$_3$(tris(8-hydroxyquinolinato)aluminum), PBD(2-(4-biphenyl)-5-(4-tert-butylphenyl)-1,3,4-oxadiazole), TAZ(3-(4-biphenyl)-4-pheynyl-5-tert-butylphenyl-1,2,4-triazole), spiro-PBD, BAlq(Bis(2-methyl-8-quinolinolate)-4-(phenylphenolato)aluminum), and SAlq. A thickness of the first electron transport layer 150 may be 1 to 150 nm. When the thickness of the first electron transport layer 150 is 1 nm or greater, a degradation of the electron transport characteristics may be prevented, or when the thickness of the first electron transport layer 150 is 150 nm or less, an increase in the thickness of the first electron transport layer 150 may be prevented and a rise in driving voltage may be therefore prevented. Accordingly, the first light emitting part ST1 comprising the first hole injection layer 120, the first hole transport layer 130, the blue light emitting layer 140, and the first electron transport layer 150 is on the anode 110.

The charge generation layer (CGL) 160 is on the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the blue light emitting layer 140 adjacent to the anode, and the P-type charge generation layer 160P supplies holes to the light emitting layer of the second light emitting part ST2. As such, the organic light emitting diode device with a plurality of emitting layers may achieve higher emission efficiency and lower driving voltage. Accordingly, the charge generation layer 160 exerts an important impact on the organic light emitting diode device's characteristics, i.e., emission efficiency or driving voltage.

Thus, the present inventors conducted several tests to improve the electron injection characteristics of the charge generation layer. By these tests, they discovered that only one host in the charge generation layer is not sufficient to inject electrons into the electron transport layer. Therefore, the present inventors performed several tests for improvement of the characteristics of the host in the charge generation layer, and found out that electron injection and electron transfer can be facilitated by including at least two hosts in the charge generation layer and creating various energy levels using at least two hosts and a dopant. The at least two hosts may be a mixed host. Also, at least one of the two or more hosts comprises a pyrene compound. The pyrene compound has a large amount of electrons because a π bond (pi bond), which is a covalent bond, exists in the compound. Hence, the pyrene compound facilitates electron injection or electron transfer, as compared to other compounds used for the charge generation layer. Therefore, the present inventors invented a novel organic light emitting diode device that can achieve higher emission efficiency and lower driving voltage, by using a charge generation compound of a novel structure.

Accordingly, the N-type charge generation layer 160N comprises at least two hosts and a dopant. The at least two hosts may be a mixed host. At least one of the two hosts comprises a charge generation compound. The charge generation compound may be a pyrene compound indicated by the following chemical formula 1. A substituent of the pyrene compound is at a position not parallel with the plane of pyrene. When the substituent is at position 1, 3, 6, or 8 of the pyrene compound, the molecular structure is bent and stabilized. A stable chemical structure of the pyrene using the substituent makes it easy for the substituent of the pyrene compound to bond to the dopant in the charge generation layer, thereby facilitating electron injection or electron transfer even more. When Li is used as the dopant, the substituent of the pyrene compound is more firmly bonded to Li, thereby facilitating electron injection or electron transfer even more.

[Chemical Formula 1]

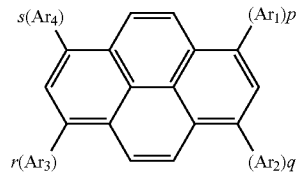

wherein p, q, r, and s are 0 or 1 and integers that satisfy 1≤q+q+r+s≤4, and $Ar_1$, $Ar_2$, $Ar_3$, and $Ar_4$ are independently at least one among the following structures:

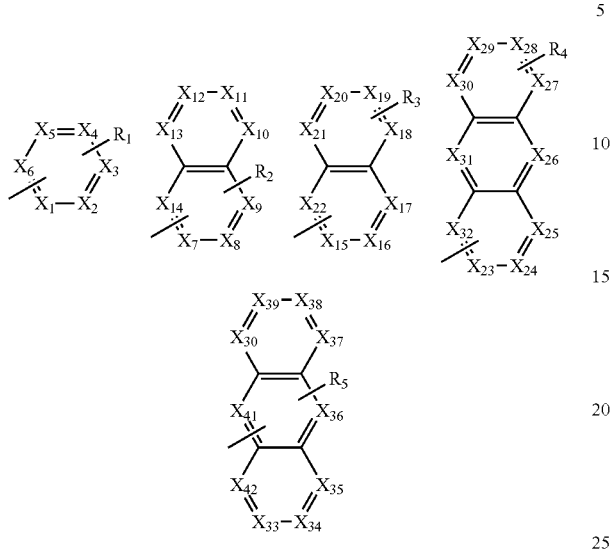

wherein at least one of $X_1$ to $X_6$, at least one of $X_7$ to $X_{14}$, at least one of $X_{15}$ to $X_{22}$, at least one of $X_{23}$ to $X_{32}$, and at least one of $X_{33}$ to $X_{42}$ comprise at least one among C, N, S, and O, and $R_1$, $R_2$, $R_3$, $R_4$, and $R_5$ are independently at least one among substituted or unsubstituted alkyl, aryl, hetero aryl, aromatic, hetero aromatic, aryl amine, and hetero aryl amine compounds. The $R_1$, $R_2$, $R_3$, $R_4$, and $R_5$ may be at least one among the structures, benzene, naphthalene, biphenyl, pyridine, quinoline, quinoxaline, fluorene, phenanthroline, and phenanthrene. The pyrene compound may be at least one among the following compounds:

NC-01

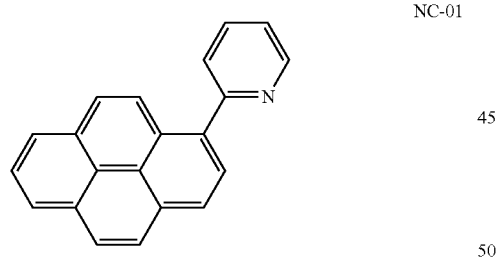

NC-02

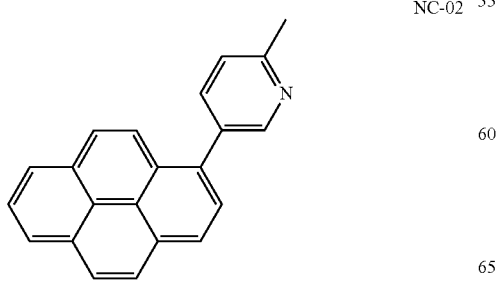

NC-03

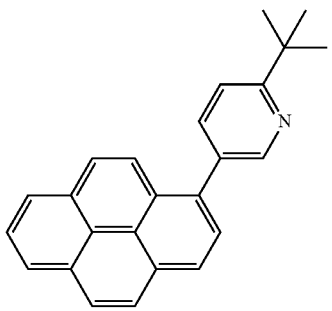

NC-04

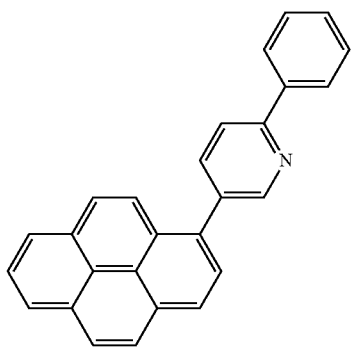

NC-05

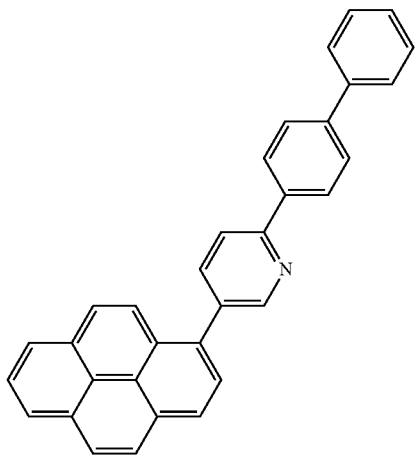

NC-06

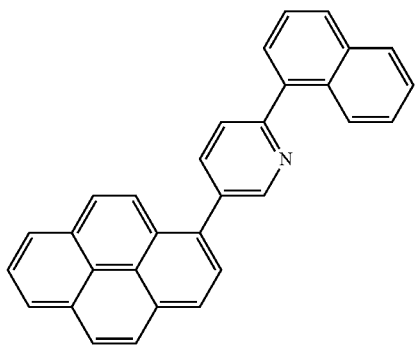

NC-07
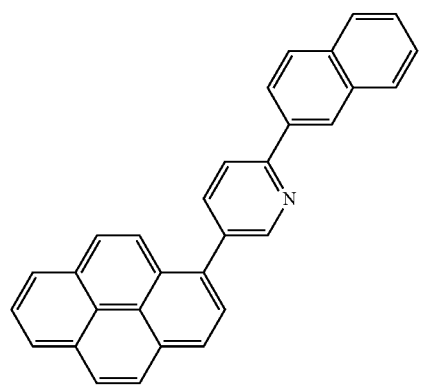
NC-08
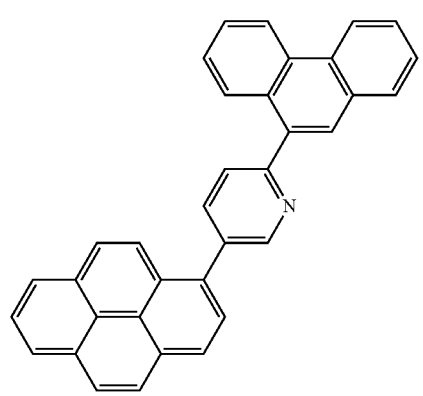
NC-09
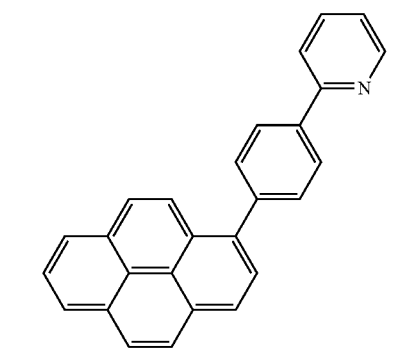
NC-10
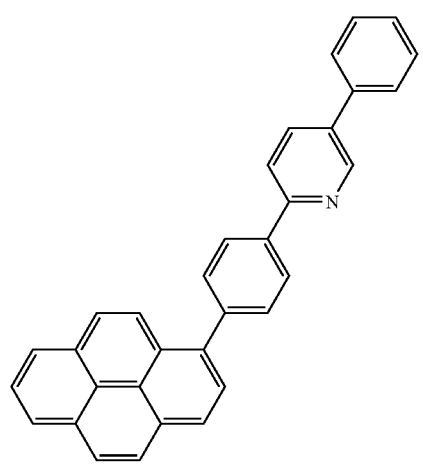
NC-11
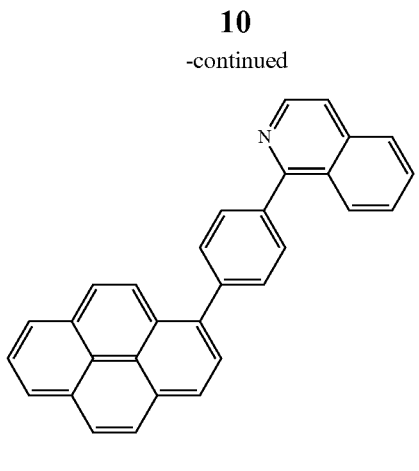
NC-12
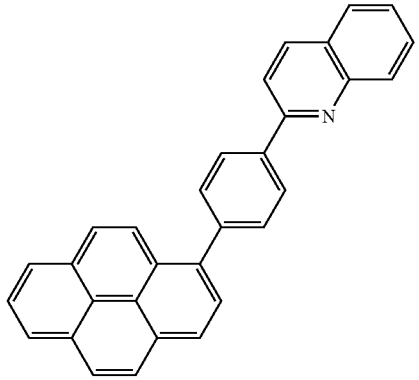
NC-13
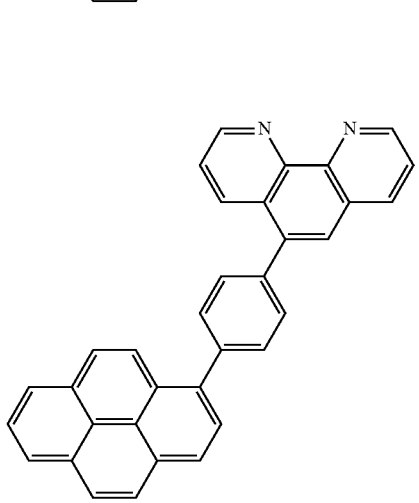
NC-14
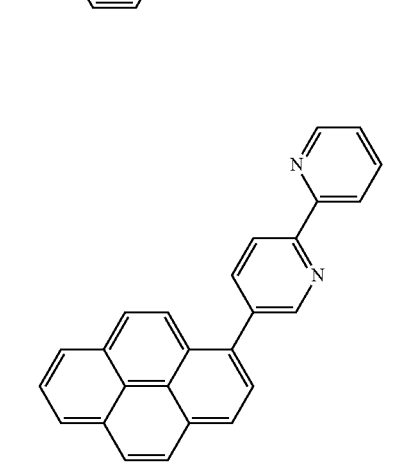

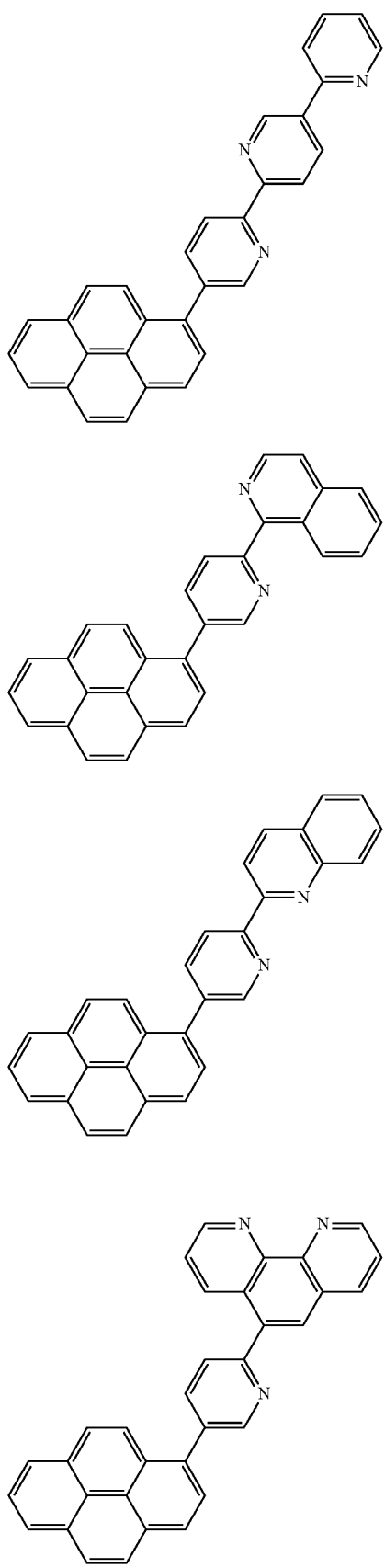
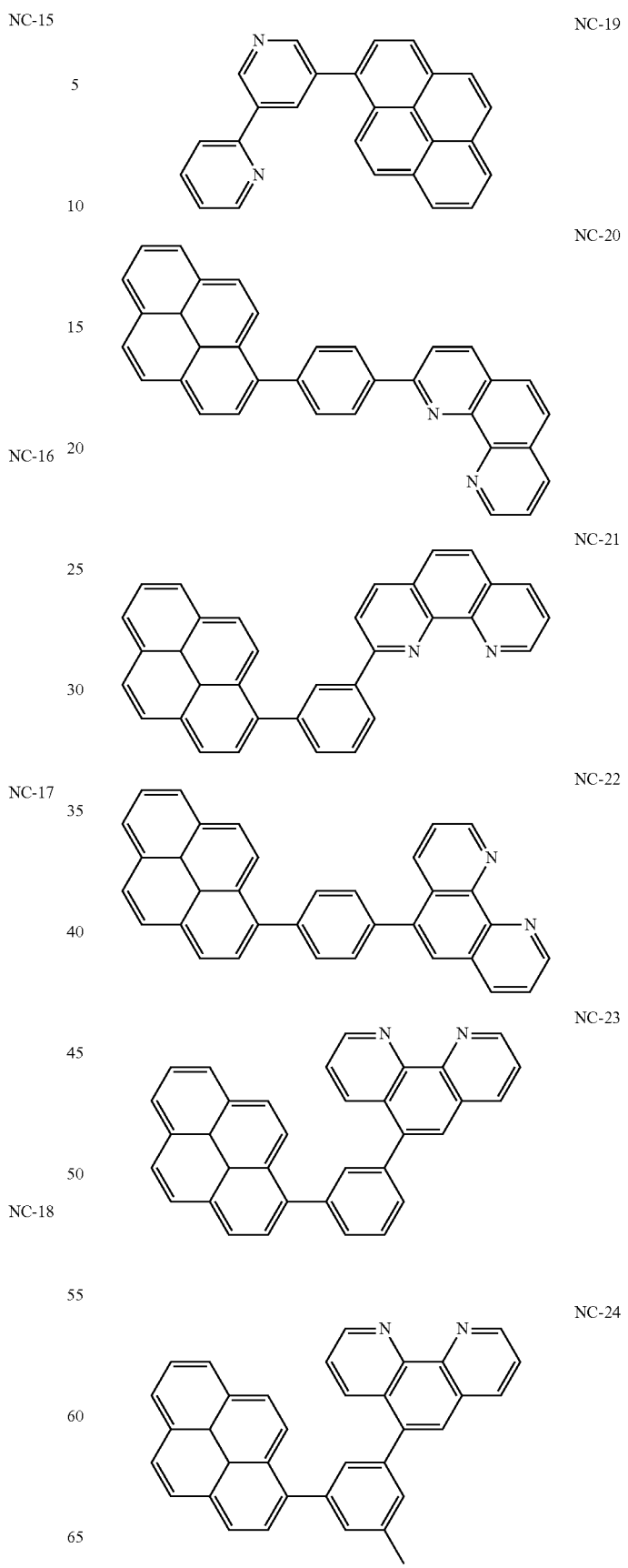

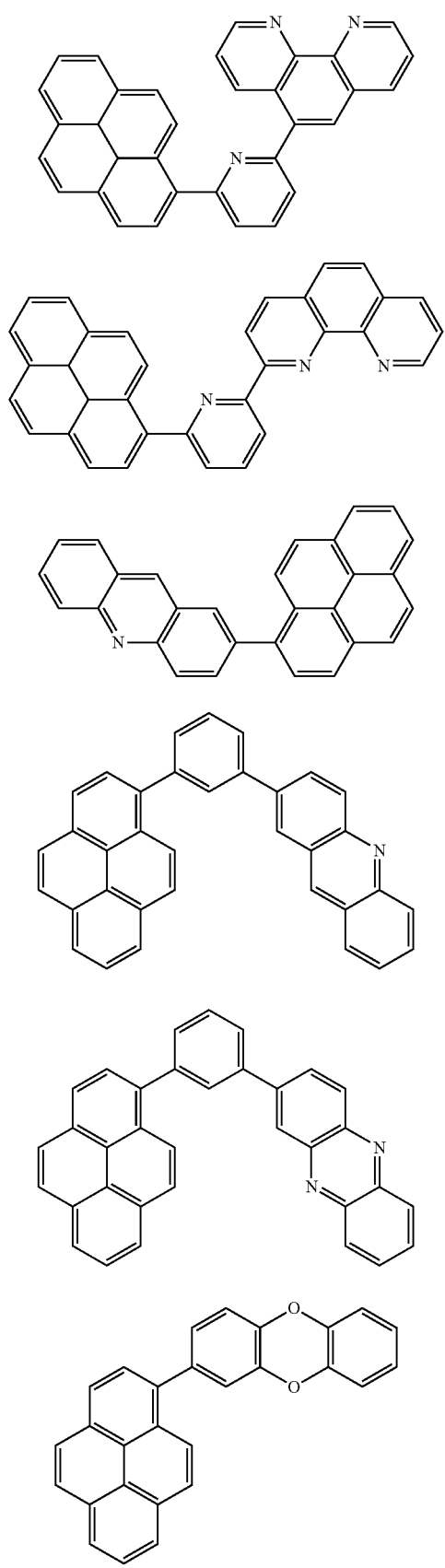
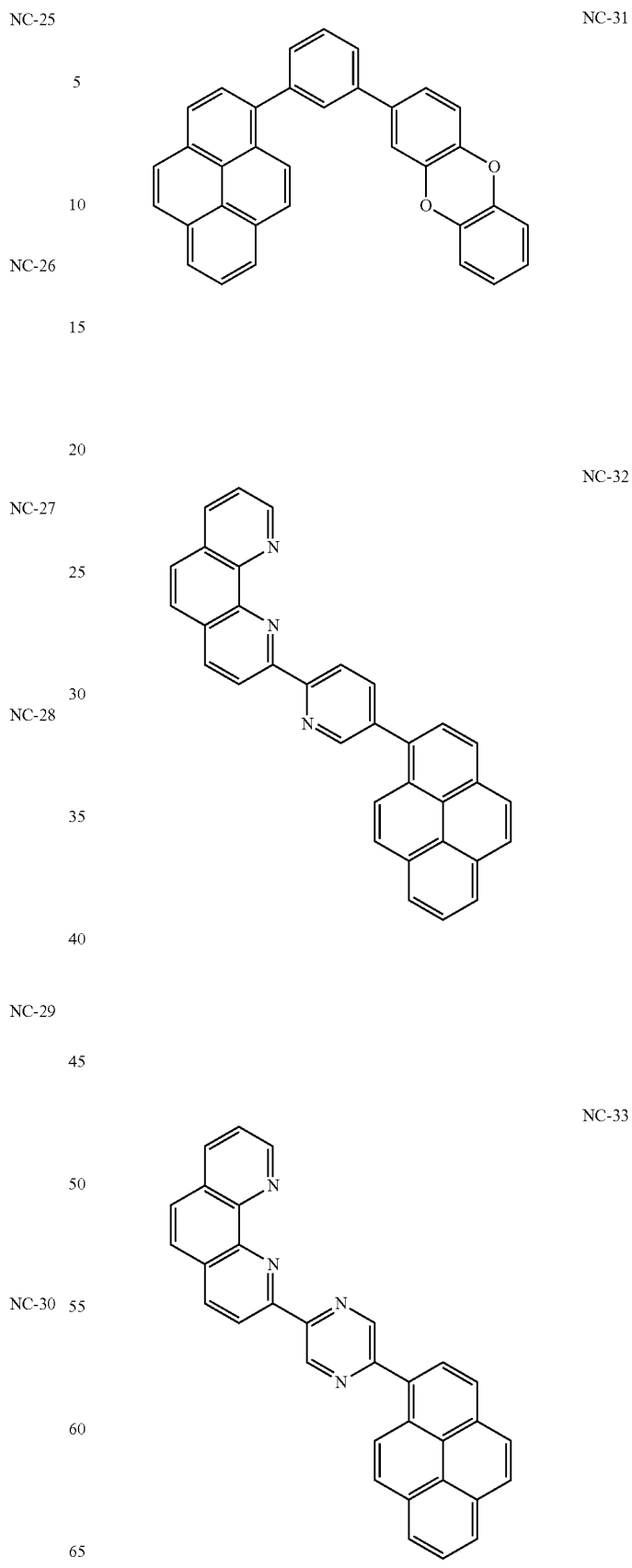

NC-34
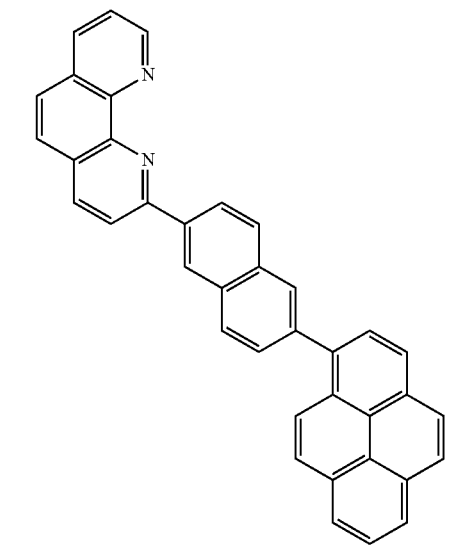
NC-35
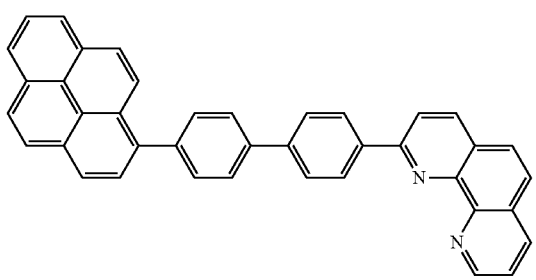
NC-36
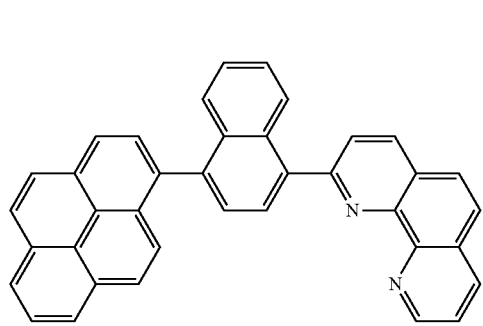
NC-37
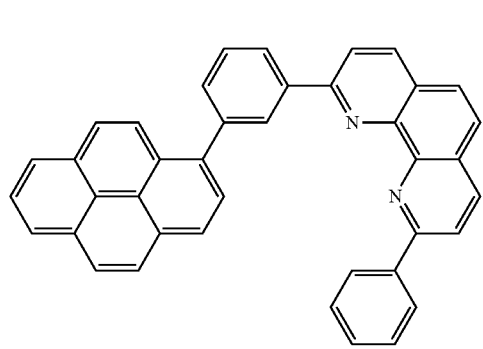
NC-38
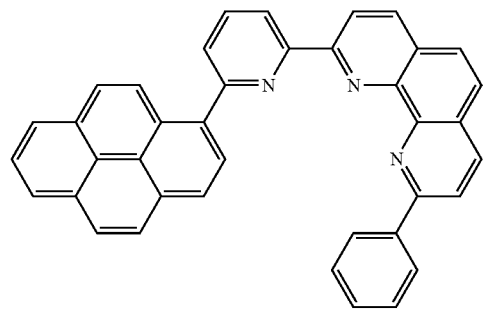
NC-39
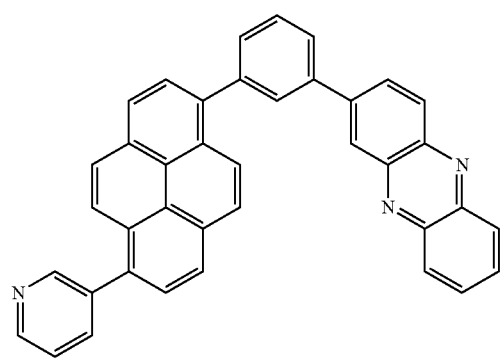
NC-40
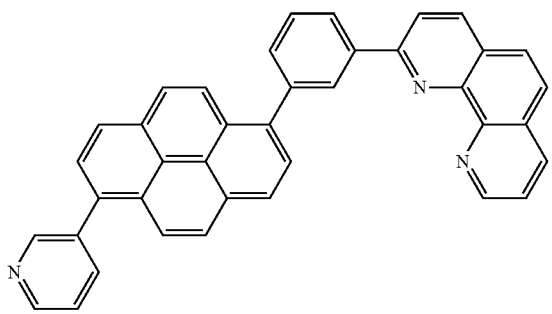
NC-41
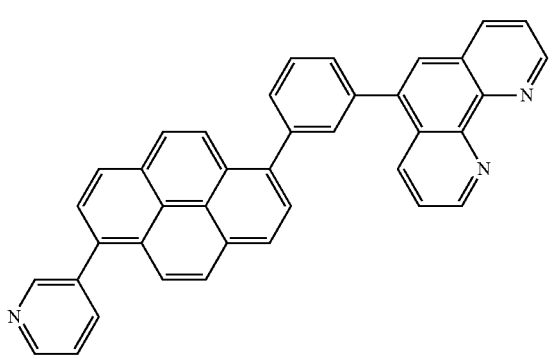

NC-42

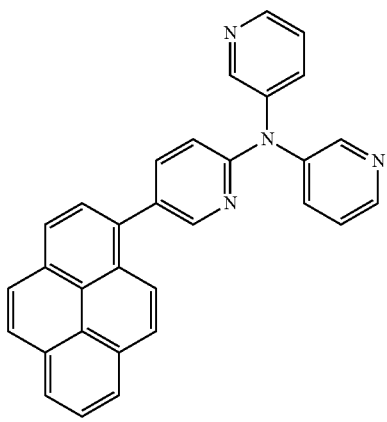

NC-43

NC-44

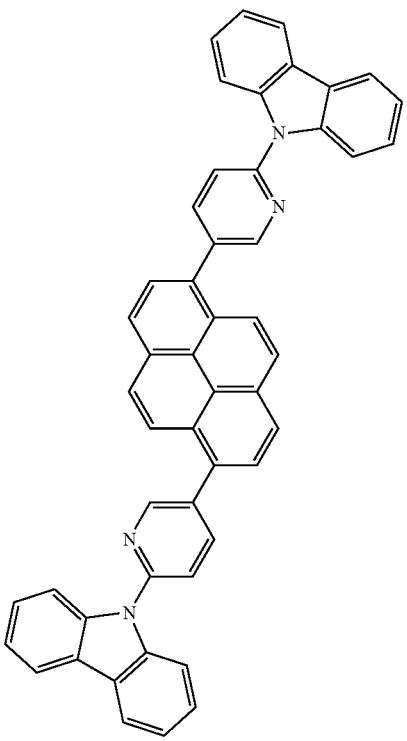

Also, when one of the hosts of the N-type charge generation layer 160N is formed of the aforementioned pyrene compound, the other host is formed of a material of the electron transport layer; for example, the other host may be formed of, but not limited to, at least one among $Alq_3$(tris(8-hydroxyquinolinato)aluminum), BPhen, PBD(2-(4-biphenyl)-5-4-tert-butylphenyl)-1,3,4-oxidiazole), TAZ(3-(4-biphenyl)-4-phenyl-5-tert-butylphenyl-1,2,4-triazole), spiro-PBD, BAlq(Bis(2-methyl-8-quinolinolate)-4-(phenylphenolato)aluminum), and SAlq. Alternatively, the pyrene compound may be used as a material of the electron transport layer. The pyrene compound used as a material of the electron transport layer includes more electrons than other materials of the electron transport layer because of the π bond present in the pyrene compound, thus facilitating electron injection or electron transfer even more.

For the two or more hosts to be included in the N-type charge generation layer 160N, the LUMO (lowest unoccupied molecular orbital) level and HOMO (higher occupied molecular orbital) level of the first host have a difference of 0.1 eV from the LUMO level and HOMO level of the second host, respectively. Accordingly, the N-type charge generation layer 160N has various energy levels, and these energy levels act as an electron injection path, making electron injection faster. This minimizes the energy barrier against electrons, and the driving voltage of the device can be therefore lowered.

The percentages of the first host and second host range from 5 to 95%, against the sum of 100% of the first host percentage and the second host percentage. When the first host percentage and the second host percentage are between 5 to 95%, the N-type charge generation layer 160N has two energy levels and these energy levels act as an electron injection path, making electron injection faster. For instance, when the percentage of the first host is 5%, the percentage of the second host may be 95%. The first host may comprise a charge generation compound or be a host having electron transport characteristics. And, when the first host comprises a charge generation compound, the second host may be a host having electron transport characteristics. Otherwise, when the first host includes a host having electron transport characteristics, the second host may comprise a charge generation compound. The first host and the second host may be referred to as a mixed host.

A thickness of the N-type charge generation layer 160N may be 50 to 400 Å. In this case, the N-type charge generation layer 160N may be a single layer of the first host and second host mixed in it or a multilayer including a first layer having the first host alone, a second layer having the first and second hosts mixed in it, and a third layer having the second host alone. When the N-type charge generation layer 160N is a single layer, the thickness of the N-type charge generation layer 160N is 50 to 400 Å. When the thickness of the N-type charge generation layer 160N is 50 Å or greater, the N-type charge generation layer 160N has two energy levels and these energy levels act as an electron injection path, making electron injection faster. On the other hand, when the thickness of the N-type charge generation layer 160N is 400 Å or less, a rise in driving voltage caused by an increase in the device thickness may be prevented. In contrast, when the N-type charge generation layer 160N is a multilayer, a thickness of the first and third layers of the N-type charge generation layer 160N each are 20 to 100 Å, and a thickness of the second layer is 10 to 200 Å, and this may prevent a rise in driving voltage and improve the electron injection characteristics. Especially, any one of the percentages of the first host and second host, in the second layer of the first and second hosts mixed in it, may gradually increase toward the third layer from the first layer.

The N-type charge generation layer 160N comprises at least two hosts and a dopant. The dopant may be an alkali metal, alkali metal compound, alkali earth metal, or alkali earth metal compound. Specifically, the dopant may be at least one or more among Li, Cs, K, Rb, Mg, Na, Ca, Sr, Eu, and Yb. The percentage of the dopant to be mixed is between 1 and 8% relative to 100% of all hosts. The dopant may have a work function of 2.5 eV or higher. The at least two hosts may be referred to as a mixed host.

The P-type charge generation layer 160P may be formed of a metal or a P-doped organic material. The metal may be at least one or more among Al, Cu, Fe, Pb, Zn, Au, Pt, W, In, Mo, Ni, and Ti. A P-type dopant and host for the P-doped organic material may be typically used materials. For example, the P-type dopant may be a material at least one among $2F_4$-TCNQ(2,3,5,6-tetrafluoro-7,7,8,8,-tetracyano-quinodimethane), a derivative of tetracyanoquinodemethane, iodine, $FeCl_3$, $FeF_3$, and $SbCl_5$. The host may be a material at least one among NPB (N,N'-bis(naphthalene-1-yl)-N,N'-bis(phenyl)-benzidine), TPD(N,N'-bis-(3-methylphenyl)-N,N'-bis(phenyl)-benzidine), and TNB(N,N,N'N'-tetranaphthalenyl-benzidine).

Meanwhile, a second light emitting part ST2 comprising a second hole injection layer 170, a second hole transport layer 180, a yellow light emitting layer 190, a second electron transport layer 200, and an electron injection layer 210 is on the charge generation layer 160. The second hole injection layer 170, the second hole transport layer 180, and the second electron transport layer 200 may have the same compositions as the first hole injection layer 120, first hole transport layer 130, and first electron transport layer 150 of the first light emitting part ST1, respectively.

The yellow light emitting layer 190 may be a yellow-green light emitting layer or a multilayer structure of a yellow-green light emitting layer and a green light emitting layer. In this exemplary embodiment, a single layer structure of the yellow-green light emitting layer will be described by way of example. The yellow light emitting layer 190 may include at least one dopant among CBP 4,4'-bis(carbazol-9-yl)biphenyl) and BAlq(Bis(2-methyl-8-quinolinolate)-4-(phenylphenolato)aluminum) and a yellow-green phosphorescent dopant that emits yellow-green light.

The electron injection layer 210 functions to facilitate the injection of electrons, and may be formed of, but not limited to, at least one among $Alq_a$ (tris(8-hydroxy-quinolinato) aluminum), PBD(2-(4-biphenyl)-5-(4-tert-butylphenyl)-1,3,4-oxadiazole), TAZ(3-(4-biphenyl)-4-pheynyl-5-tert-butyl-phenyl-1,2,4-triazole), spiro-PBD, BAlq(Bis(2-methyl-8-quinolinolate)-4-(phenylphenolato)aluminum), and SAlq. The electron injection layer 210 may be formed of a metal compound, and examples of the metal compound may comprise, but are not limited to, at least one or more among LiQ, LiF, NaF, KF, RbF, CsF, FrF, $BeF_2$, $MgF_2$, $CaF_2$, $SrF_2$, $BaF_2$, and $RaF_2$. The thickness of the electron injection layer 210 may be 1 to 50 nm. When the thickness of the electron injection layer 210 is 1 nm or greater, a degradation of the electron injection characteristics may be prevented, or when the thickness of the electron injection layer 210 is 50 nm or less, an increase in the thickness of the electron injection layer 210 may be prevented and a rise in driving voltage may be therefore prevented. Accordingly, the second light emitting part ST2 comprising the second hole injection layer 170, the second hole transport layer 180, the yellow light emitting layer 190, the second electron transport layer 200, and the electron injection layer 210 is on the charge generation layer 160.

The cathode 220 is on the second light emitting part ST2. The cathode 220 is an electron injection electrode, and may be formed of magnesium (Mg), calcium (Ca), aluminum (Al), silver (Ag), or an alloy thereof, having a low work function. When the organic light emitting diode device is a top-emission type or a dual-emission type, the cathode 220 may be formed thin thickness enough to pass light therethrough. When the organic light emitting diode device is a bottom-emission type, the cathode 220 may be formed thick enough to reflect light.

As stated above, the present invention has the advantage of reducing the difference in energy level between the P-type charge generation layer and the N-type charge generation layer by locating the charge generation layer between the first light emitting part and the second light emitting part and using a pyrene compound as the N-type charge generation layer.

Figure 2:
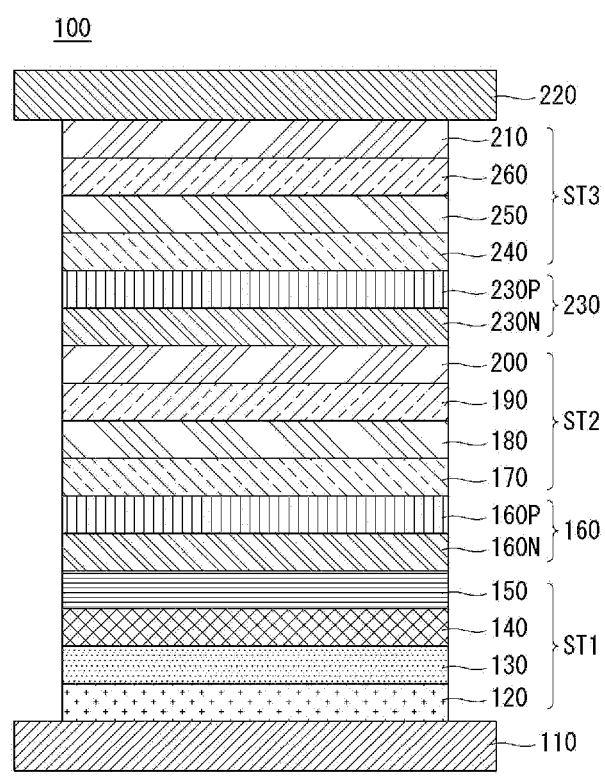
FIG. 2 is a view showing an organic light emitting diode device according to a second exemplary embodiment of the present invention.

FIG. 2 is a view showing an organic light emitting diode device according to a second exemplary embodiment of the present invention. The same elements as the first exemplary embodiment are denoted by the same reference numerals, so descriptions of these elements will be omitted.

Referring to FIG. 2, the organic light emitting diode device 100 of this invention comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 forms a single light emitting diode, and comprises a first light emitting layer 140. The first light emitting layer 140 may emit light of red, green, or blue, and may be a blue light emitting layer in this exemplary embodiment. The first light emitting part ST1 further comprises a first hole injection layer 120 and a first hole transport layer 130 that are between the anode 110 and the first light emitting layer 140. Also, the first light emitting part ST1 further comprises a first electron transport layer 150 over the first light emitting layer 140. Accordingly, the first light emitting part ST1 comprising the first hole injection layer 120, first hole transport layer 130, first light emitting layer 140, and first electron transport layer 150 is on the anode 110.

A first charge generation layer 160 is on the first light emitting part ST1. The first charge generation layer 160 is a PN-junction charge generation layer formed by joining an N-type charge generation layer 160N and a P-type charge generation layer 160P. The first charge generation layer 160 generates a charge, or injects the charge, i.e., electrons and holes, separately into the light emitting layers. The N-type charge generation layer 160N comprises at least two hosts and a dopant, and has various energy levels. These energy levels act as a transfer path through which electrons are injected from the P-type charge generation layer 160P into the N-type charge generation layer 160N, lowering the energy barrier between the P-type charge generation layer 160P and the N-type charge generation layer 160N. Therefore, electrons may be moved faster into the first light emitting layer 140, thereby improving the organic light emitting diode device's electron injection capability and lowering the driving voltage. The P-type charge generation layer 160P has the same composition as the first exemplary embodiment.

Meanwhile, the second light emitting part ST2 comprising a second light emitting layer 190 is located over the first charge generation layer 160. The second light emitting layer 190 may emit light of red, green, or blue. In this exemplary embodiment, the second light emitting layer 190 may be, for example, a yellow light emitting layer. The yellow light emitting layer 190 may be a yellow-green light emitting layer or a multilayer structure of a yellow-green light emitting layer and a green light emitting layer. The second light emitting part ST2 further comprises a second hole injection layer 170 and a second hole transport layer 180 that are between the first charge generation layer 160 and the second light emitting layer 190, and also further comprises a second electron transport layer 200 over the second light emitting layer 190. Accordingly, the second light emitting part ST2 comprising the second hole injection layer 170, second hole transport layer 180, second light emitting layer 190, and second electron transport layer 200 is on the first charge generation layer 160.

A second charge generation layer 230 is on the second light emitting part ST2. The second charge generation layer 230 is a PN-junction charge generation layer formed by joining an N-type charge generation layer 230N and a P-type charge generation layer 230P. The second charge generation layer 230 generates a charge, or injects the charge, i.e., electrons and holes, separately into the light emitting layers. The N-type charge generation layer 230N has the same composition as the N-type charge generation layer 160N of the first charge generation layer 160, so a description of it will be omitted. The P-type charge generation layer 160 also has the same composition as the P-type charge generation 160P of the first charge generation layer 160.

Meanwhile, the third light emitting part ST3 comprising a third light emitting layer 250 is on the second charge generation layer 230. The third light emitting layer 250 may emit light of red, green, or blue. In this exemplary embodiment, the third light emitting layer 250 may be, for example, a blue light emitting layer. The blue light emitting layer comprises a blue light emitting layer, a dark blue light emitting layer, or a sky blue light emitting layer. The third light emitting part ST3 further comprises a second hole transport layer 240 between the second charge generation layer 230 and the third light emitting layer 250, and also further comprises a third electron transport layer 260 and an electron injection layer 210 over the third light emitting layer 250. Accordingly, the third light emitting part ST3 comprising the third hole transport layer 240, third light emitting layer 250, third electron transport layer 230, and electron injection layer 210 is formed on the second charge generation layer 230. The cathode 220 is on the third light emitting part ST3, thereby completing the organic light emitting diode device according to the second exemplary embodiment of the present invention.

The N-type charge generation layers 160N and 230N each comprise at least two hosts and a dopant, and have various energy levels. These energy levels act as a transfer path through which electrons are injected from the P-type charge generation layers 160P and 230P to the N-type charge generation layers 160N and 230N, lowering the energy barrier between the P-type charge generation layers 160P and 230P and the N-type charge generation layers 160N and 230N. Therefore, electrons can be moved faster into the first light emitting layer 140 or the second light emitting layer 190, thereby improving the organic light emitting diode device's capability of injecting electrons and lowering the driving voltage. Moreover, the first light emitting layer 140 or the second light emitting layer 190 may have higher efficiency, thereby delivering increased efficiency to the organic light emitting diode device.

The above-described organic light emitting diode device of FIG. 2 has been illustrated and described with an example where the N-type charge generation layers 160N and 230N each comprise a mixture of at least two hosts and a dopant, and at least one of the two hosts is made of a pyrene compound. However, the present invention is not limited to this example, and only the N-type charge generation layer of at least one the first and second charge generation layers may comprise a mixture of at least two hosts and a dopant and at least one of these hosts may be formed of a pyrene compound. The at least two hosts may be referred to as a mixed host.

Figure 3:
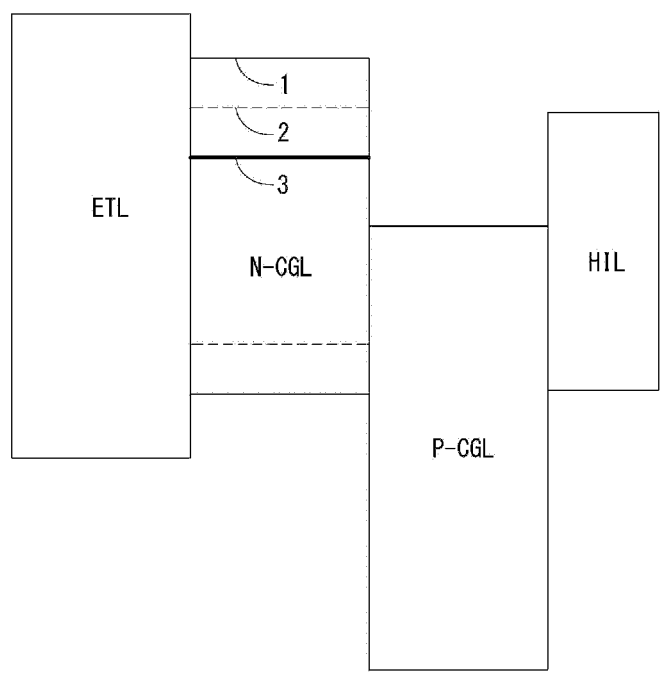
FIG. 3 is an energy band diagram of the organic light emitting diode device according to the first exemplary embodiment of the present invention.

FIG. 3 is an energy band diagram of the organic light emitting diode device according to the first exemplary embodiment of the present invention.

Referring to FIG. 3, the organic light emitting diode device having the above-described composition according to the exemplary embodiment of the present invention comprises an N-type charge generation layer N-CGL in which a first host, a second host, and a dopant are mixed. Due to this, the N-type charge generation layer N-CGL has an energy level (1) created by the first host, an energy level (2) created by the second host, and an energy level (3) created by the dopant. Accordingly, various energy levels in the N-type charge generation layer N-CGL can extend the transfer path through which electrons are injected, and lower the energy barrier against electrons, thereby facilitating electron injection.

Moreover, the at least two hosts in the N-type charge generation layer facilitate electron transfer or electron injection. Hence, more electrons can be injected into the electron transport layer, coming into balance with large amounts of holes injected from the cathode.

In addition, the at least two hosts in the N-type charge generation layer can lower the energy barrier against electrons, thereby lowering the device's driving voltage.

Furthermore, electrons injected smoothly at various energy levels may achieve a charge balance. This contributes to efficiency optimization, and reduces roll-off associated with a decrease in emission efficiency in a high-current range.

Furthermore, one of the at least two hosts in the N-type charge generation layer is formed of a charge generation compound of pyrene. Thus, various energy levels may be created using the at least two hosts, and these energy levels act as an electron injection path, making electron injection faster. Also, a substituent of the pyrene compound, which is one of the at least two hosts, is at a position not parallel with the plane of pyrene, which makes the pyrene compound firmly bonded to the dopant in the N-type charge generation layer. Therefore, electron injection or electron transfer can be made easier, and the tunneling effect of electrons or holes in interface adjacent to the N-type charge generation layer N-CGL can be maximized.

Further, the at least two hosts create various energy levels by co-deposition with the alkali metal, i.e., the dopant included in the N-type charge generation layer N-CGL, thereby maximizing the tunneling effect of electrons or holes in interface adjacent to the N-type charge generation layer N-CGL. Accordingly, the efficiency of the emitting layers can be improved, and the organic light emitting diode device can achieve higher emission efficiency and lower driving voltage.

Hereinafter, exemplary embodiments for manufacturing an organic light emitting diode device comprising a pyrene compound according to the present invention will be disclosed. The thicknesses, conditions of formation, etc of the following charge generation layers do not limit the scope of the present invention.

Test 1: Organic Light Emitting Diode Device with Blue Light Emitting Part and Yellow Light Emitting Part Comparative Example 1

An organic light emitting diode device was manufactured by forming, on an substrate, a first light emitting part comprising a blue light emitting layer and a second light emitting part comprising a yellow light emitting layer, and a P-type charge generation layer, an N-type charge generation layer and then forming a cathode. The N-type charge generation layer was made to a thickness of 100 Å by doping a phenanthroline compound host with 2% of Li. The yellow light emitting layer includes a yellow-green light emitting layer.

Exemplary Embodiment 1

Using the same composition as the foregoing Comparative Example 1, an organic light emitting diode device was manufactured, except that the host of the N-type charge generation layer was formed of an NC-20 compound and a phenanthroline compound and doped with 2% of Li as a dopant.

The driving voltage, emission efficiency, and quantum efficiency of the organic light emitting diode devices manufactured according to Comparative Example 1 and Exemplary Embodiment 1 were measured and shown in the following Table 1. Also, the current density versus driving voltage was measured and shown in FIG. 4, the emission spectrum were measured and shown in FIG. 5, and the quantum efficiency versus luminance was measured and shown in FIG. 6 (In this case, the devices were driven at 10 mA/cm$^2$)

TABLE 1

|  | driving voltage (V) | Emission efficiency (Cd/A) | Quantum efficiency (%) |
| --- | --- | --- | --- |
| Comparative Example 1 | 7.7 | 78.4 | 29.4 |
| Exemplary Embodiment 1 | 7.4 | 80.1 | 29.9 |

Figure 4:
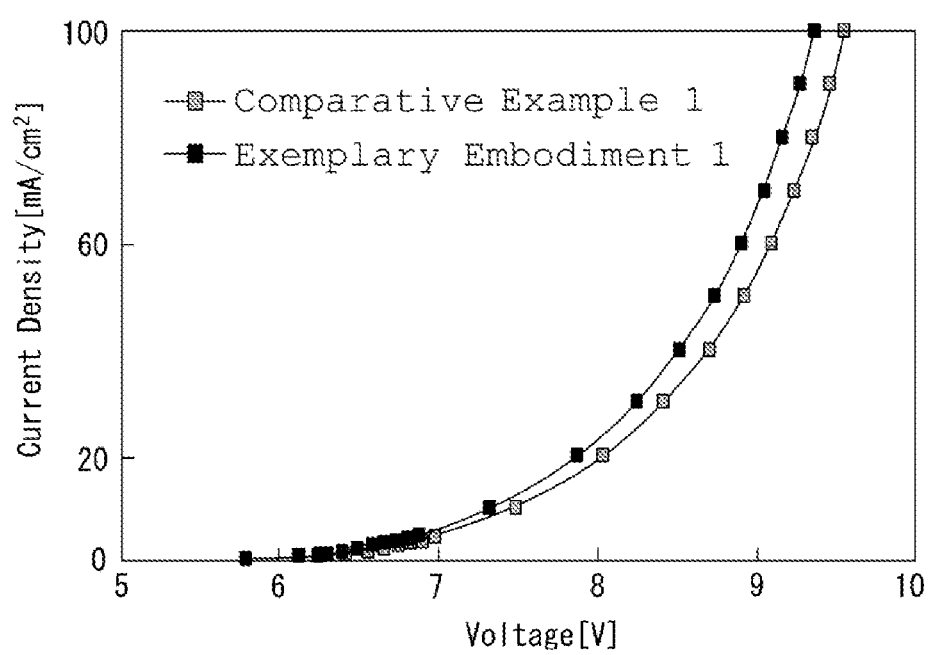
FIG. 4 is a graph of the current density vs. driving voltage of organic light emitting diode devices manufactured according to Comparative Example 1 and Exemplary Embodiment 1 of the present invention.
Figure 5:
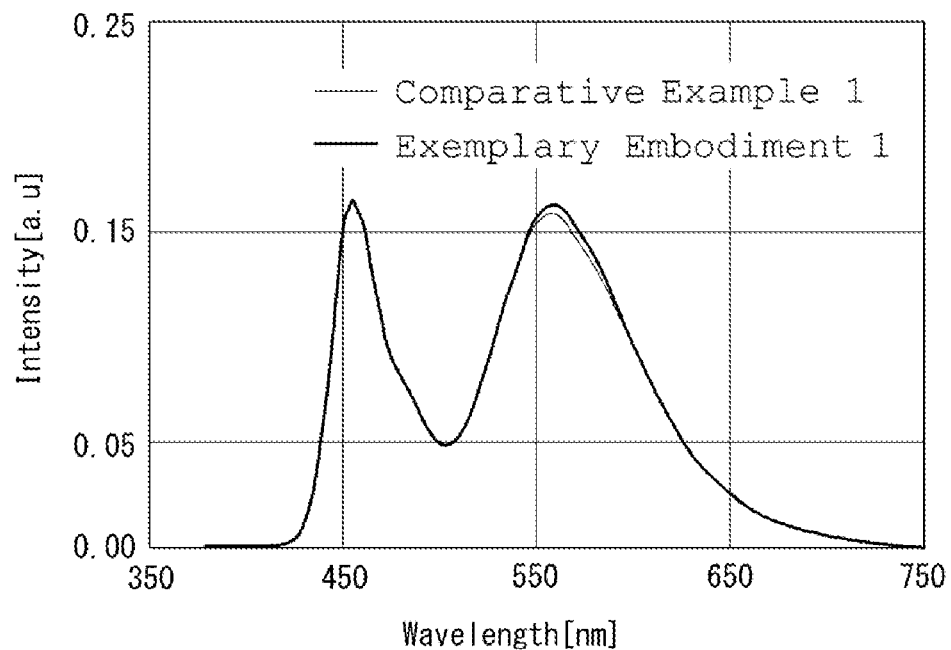
FIG. 5 is a graph of the emission spectrum of the organic light emitting diode devices manufactured according to Comparative Example 1 and Exemplary Embodiment 1 of the present invention.
Figure 6:
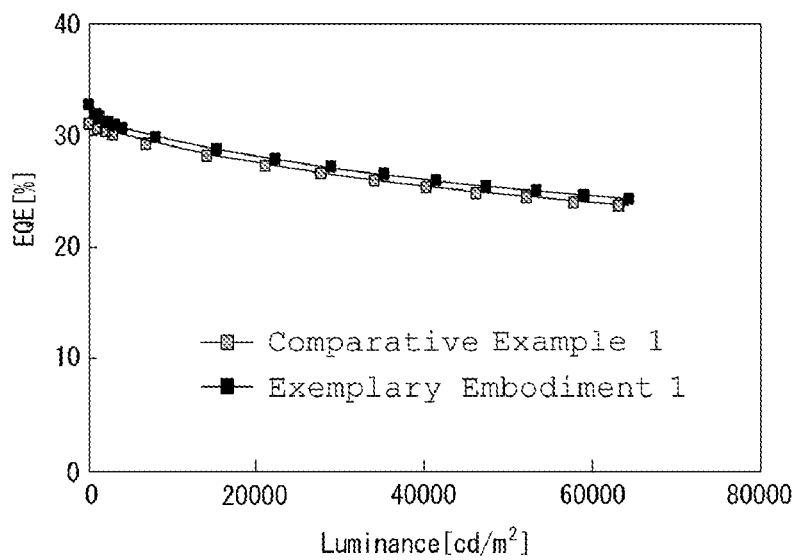
FIG. 6 is a graph of the quantum efficiency vs. luminance of the organic light emitting diode devices manufactured according to Comparative Example 1 and Exemplary Embodiment 1 of the present invention.

As shown in Table 1 and FIG. 4, it was observed that the driving voltage of Exemplary Embodiment 1 according to the present invention was 0.3 V lower than Comparative Example 1. Also, as shown in Table 1, it was observed that the emission efficiency of Exemplary Embodiment 1 was 1.7 Cd/A higher than Comparative Example 1. Also, as shown in Table 1 and FIG. 6, the quantum efficiency of Exemplary Embodiment 1 was 0.5% higher than Comparative Example 1. As shown in FIG. 5, Exemplary Embodiment 1 according to the present invention showed an increase of emission intensity compared to Comparative Example 1 at wavelengths of 520 to 590 nm where yellow-green light is emitted.

Test 2: Organic Light Emitting Diode Device having Blue Light Emitting Part, Yellow Light Emitting Part and Blue Light Emitting Part Comparative Example 2

An organic light emitting diode device was manufactured by forming, on a substrate, a first light emitting part comprising a blue light emitting layer, a second light emitting part comprising a yellow light emitting layer, a P-type charge generation layer, an N-type charge generation layer, and a third light emitting part comprising a blue light emitting layer, and then forming a cathode. Each N-type charge generation layer was made to a thickness of 100 Å by doping a Bphen host with 2% of Li. The yellow light emitting layer includes yellow-green light emitting layer.

Comparative Example 3

Using the same composition as the foregoing Comparative Example 2, an organic light emitting diode device was manufactured by using a mixture of Bphen and a phenanthroline compound as the host of each N-type charge generation layer.

Exemplary Embodiment 2

Using the same composition as the foregoing Comparative Example 2, an organic light emitting diode device was manufactured, except that the host of each N-type charge generation layer was formed of an NC-20 compound and a phenanthroline compound and doped with 2% of Li as a dopant.

The driving voltage, emission efficiency, and quantum efficiency of the organic light emitting diode devices manufactured according to Comparative Examples 2 and 3 and Exemplary Embodiment 2 were measured and shown in the following Table 2. Also, the current density vs. driving voltage was measured and shown in FIG. 7, and the quantum efficiency versus luminance of the organic light emitting diode devices was measured and shown in FIG. 8. Also, the emission spectrum of the organic light emitting diode devices manufactured according to Comparative Example 2 and Exemplary Embodiment 2 were measured and shown in FIG. 9, and the emission spectrum of the organic light emitting diode devices according to Comparative Example 3 and Exemplary Embodiment 2 were measured and shown in FIG. 10.

TABLE 2

| | driving voltage (V) | Emission efficiency (Cd/A) | Quantum efficiency (%) |
|---|---|---|---|
| Comparative Example 2 | 13.9 | 77.4 | 34.1 |
| Comparative Example 3 | 12.1 | 88.0 | 37.6 |
| Exemplary Embodiment 2 | 12.7 | 88.4 | 38.9 |

Referring to Table 2 and FIGS. 7 to 10, the device according to Exemplary Embodiment 2 of the present invention showed lower driving voltage and higher emission efficiency and quantum efficiency compared to the devices according to Comparative Examples 2 and 3.

Figure 7:
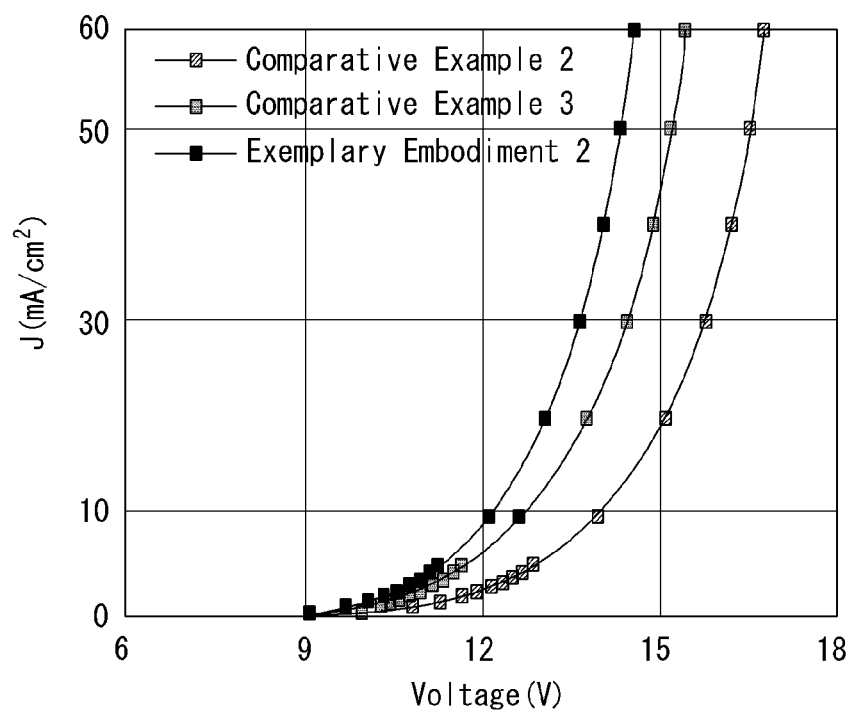
FIG. 7 is a graph of the current density vs. driving voltage of organic light emitting diode devices manufactured according to Comparative Examples 2 and 3 and Exemplary Embodiment 2 of the present invention.
Figure 8:
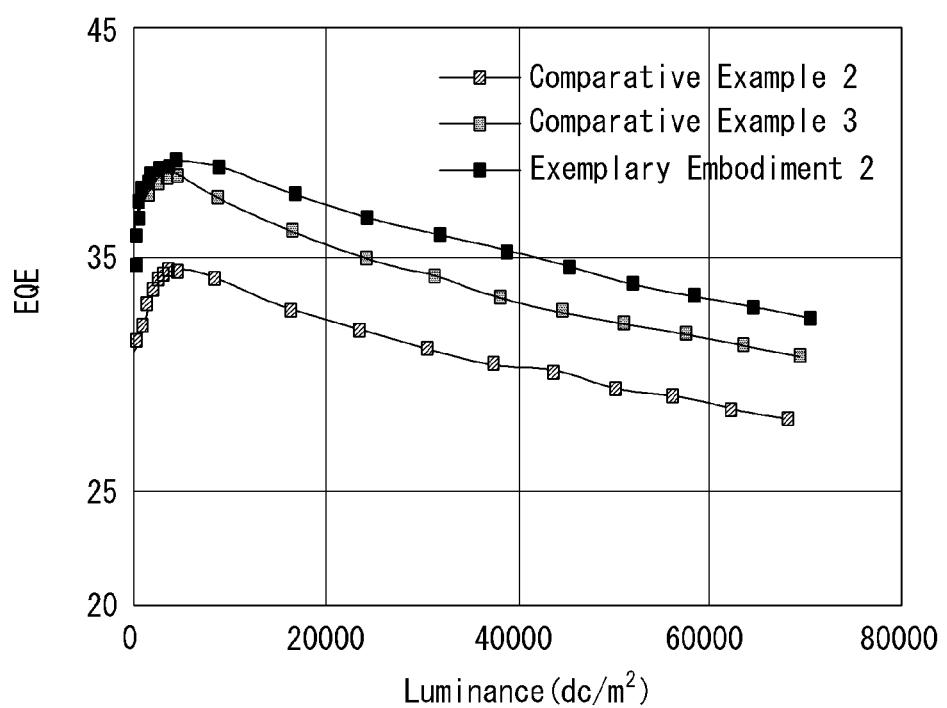
FIG. 8 is a graph of the quantum efficiency vs. luminance of the organic light emitting diode devices manufactured according to Comparative Examples 2 and 3 and Exemplary Embodiment 2 of the present invention.

As shown in Table 2 and FIG. 7, it was observed that the driving voltage of Exemplary Embodiment 2 according to the present invention was 1.2 V lower than Comparative Example 2. Also, as shown in Table 2, it was observed that the emission efficiency of Exemplary Embodiment 2 was 0.4 to 11.0 Cd/A higher than Comparative Examples 2 and 3. Also, as shown in Table 2 and FIG. 9, the quantum efficiency of Exemplary Embodiment 2 was 1.3 to 4.8% higher than Comparative Examples 2 and 3.

Figure 9:
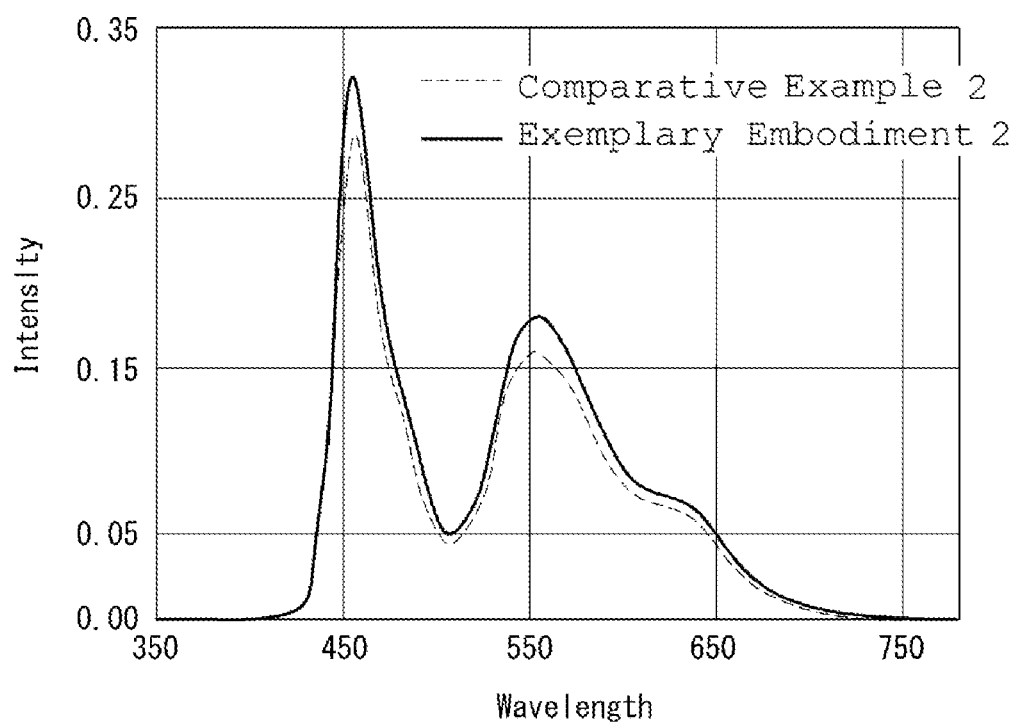
FIG. 9 is a graph of the emission spectrum of the organic light emitting diode devices manufactured according to Comparative Example 2 and Exemplary Embodiment 2 of the present invention.
Figure 10:
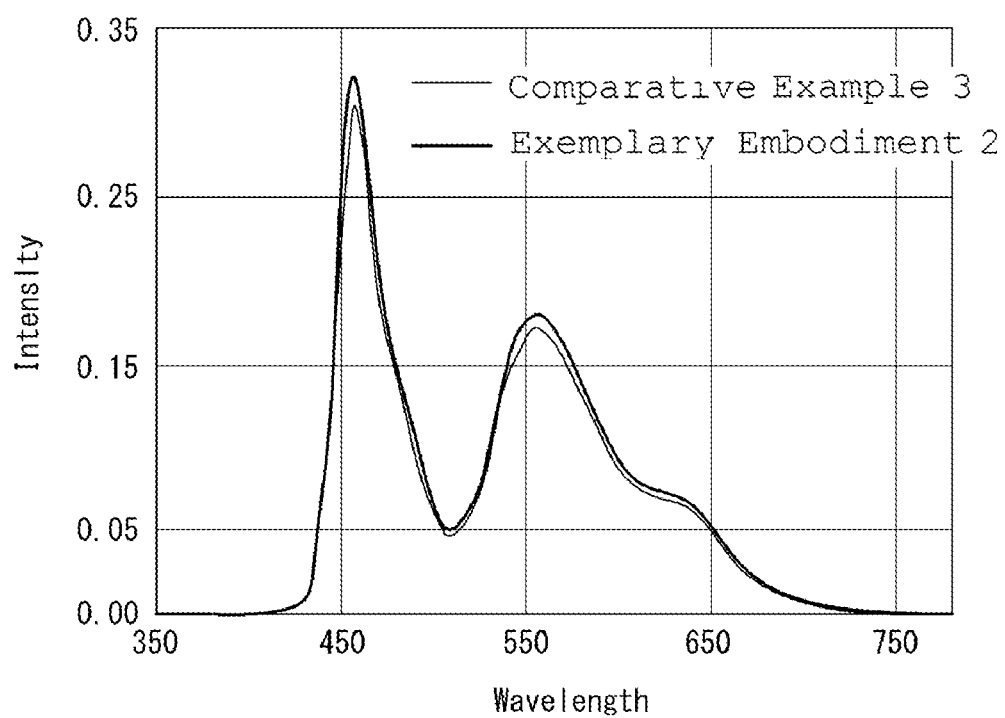
FIG. 10 is a graph of the emission spectrum of the organic light emitting diode devices manufactured according to Comparative Example 3 and Exemplary Embodiment 2 of the present invention.

As shown in FIGS. 9 and 10, Exemplary Embodiment 2 according to the present invention showed an increase of emission intensity compared to Comparative Examples 2 and 3 at wavelengths of 440 to 480 nm where blue light is emitted. Also, Exemplary Embodiment 2 according to the present invention showed an increase of emission intensity compared to Comparative Examples 2 and 3 at wavelengths of 520 to 590 nm where yellow-green light is emitted.

In an organic light emitting diode device according to an exemplary embodiment of the present invention, a mixed host having at least two hosts is used for an N-type charge generation layer to allow for various energy levels created by the at least two hosts. The various energy levels can extend the transfer path through which electrons are injected, and lower the energy barrier against electrons, thereby facilitating electron injection.

Moreover, the at least two hosts in the N-type charge generation layer facilitate electron transfer or electron injection. Hence, more electrons can be injected into the electron transport layer, coming into balance with large amounts of holes injected from the cathode.

In addition, the at least two hosts in the N-type charge generation layer can lower the energy barrier against electrons, thereby lowering the device's driving voltage.

Furthermore, electrons injected smoothly at various energy levels can achieve a charge balance. This contributes to efficiency optimization, and reduces roll-off phenomenon associated with a decrease in emission efficiency in a high-current range.

Furthermore, one of the at least two hosts in the N-type charge generation layer is formed of a charge generation compound of pyrene. Thus, various energy levels can be created using the at least two hosts, and these energy levels act as an electron injection path, making electron injection faster.

Also, a substituent of the pyrene compound, which is one of the at least two hosts, is located at a position not parallel with the plane of pyrene, which makes the pyrene compound firmly bonded to the dopant in the N-type charge generation layer. Therefore, electron injection or electron transfer can be made easier, and the tunneling of electrons or holes in interface adjacent to the N-type charge generation layer N-CGL can be maximized.

Further, the at least two hosts create various energy levels by co-deposition with the alkali metal, i.e., the dopant included in the N-type charge generation layer N-CGL, thereby maximizing the tunneling effect of electrons or holes in interface adjacent to the N-type charge generation layer N-CGL. Accordingly, the efficiency of the emitting layers can be improved, and the organic light emitting diode device can achieve higher emission efficiency and lower driving voltage.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode device comprising:
a first light emitting part between an anode and a cathode, the first light emitting part including a first light emitting layer;
a second light emitting part comprising a second light emitting layer on the first light emitting part; and
a first charge generation layer between the first light emitting part and the second light emitting part,
wherein the first charge generation layer comprises an N-type charge generation layer and a P-type charge generation layer, and the N-type charge generation layer includes at least two hosts and a dopant, and at least one of the at least two hosts includes a pyrene compound indicated by the following Chemical Formula 1:

[Chemical Formula 1]

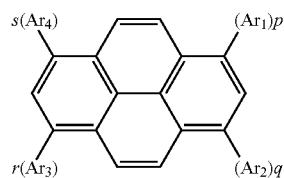

wherein each of p, q, r, and s is 0, 1 or an integer that satisfies 1≤p+q+r+s≤4, and $Ar_1$, $Ar_2$, $Ar_3$, and $Ar_4$ are independently at least one among the following structures:

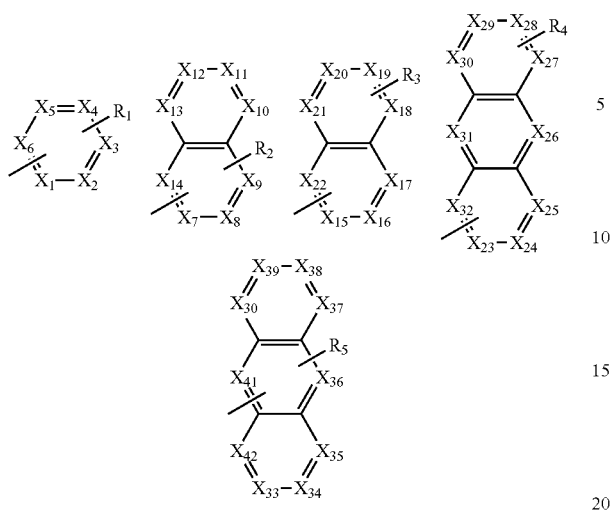

wherein at least one of $X_1$ to $X_6$, at least one of $X_7$ to $X_{14}$, at least one of $X_{15}$ to $X_{22}$, at least one of $X_{23}$ to $X_{32}$, and at least one of $X_{33}$ to $X_{42}$ comprise at least one among C, N, S, and O, and $R_2$, $R_3$, $R_4$, and $R_5$ are independently at least one among substituted or unsubstituted alkyl, aryl, hetero aryl, aryl amine, and hetero aryl amine compounds, and $R_1$ is at least one among H, substituted or unsubstituted alkyl, aryl, hetero aryl, aryl amine, and hetero aryl amine compounds.

2. The organic light emitting diode device of claim 1, wherein the first light emitting part further comprises a hole transport layer between the anode and the first light emitting layer, and an electron transport layer between the first light emitting layer and the first charge generation layer.

3. The organic light emitting diode device of claim 1, wherein the second light emitting part further comprises a hole transport layer between the first charge generation layer and the second light emitting layer, and an electron transport layer and an electron injection layer between the second light emitting layer and the cathode.

4. The organic light emitting diode device of claim 1, wherein a thickness of the N-type charge generation layer is 50 to 400 Å.

5. The organic light emitting diode device of claim 1, wherein at least one of the at least two hosts has electron transport characteristics.

6. The organic light emitting diode device of claim 1, wherein the $R_1$, $R_2$, $R_3$, $R_4$, and $R_5$ are at least one among the structures benzene, naphthalene, biphenyl, pyridine, quinoline, quinoxaline, fluorene, phenanthroline, and phenanthrene.

7. The organic light emitting diode device of claim 1, wherein the pyrene compound is at least one among following compounds:

NC-01
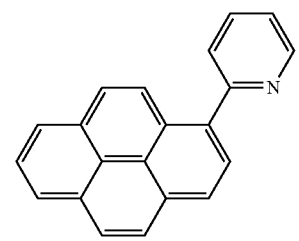

NC-02
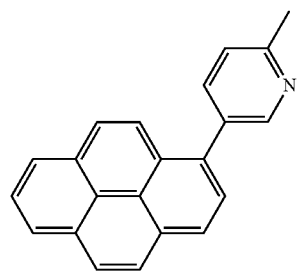

NC-03
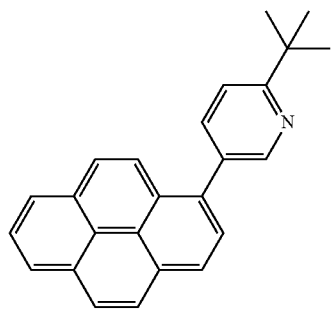

NC-04
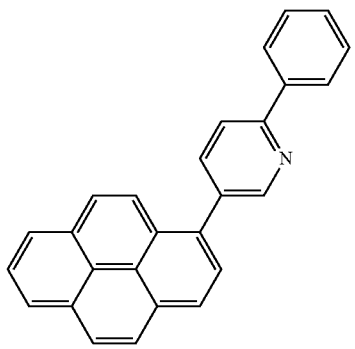

NC-05
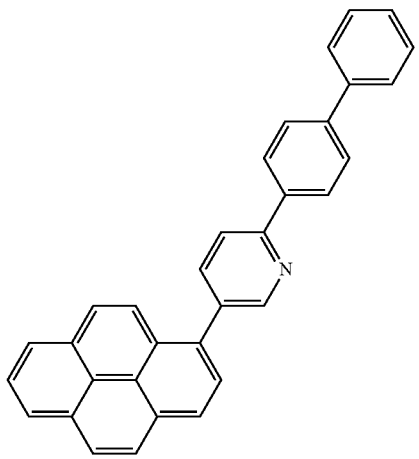

NC-06
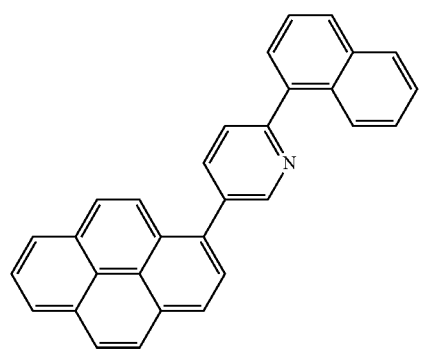
NC-07
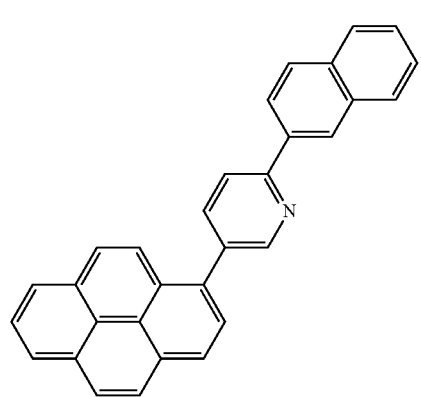
NC-08
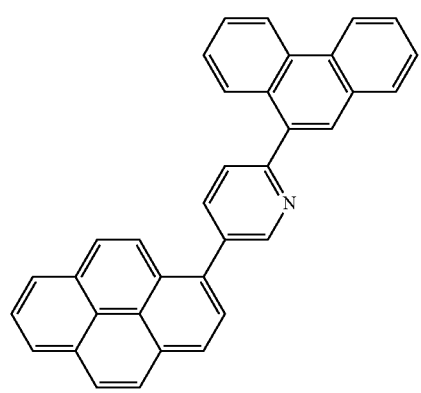
NC-09
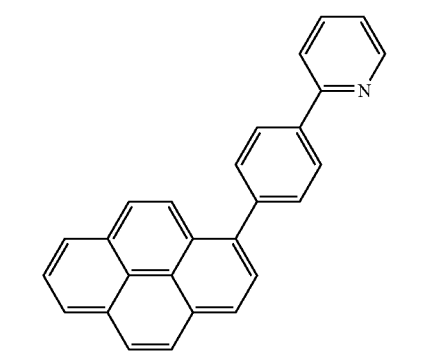
NC-10
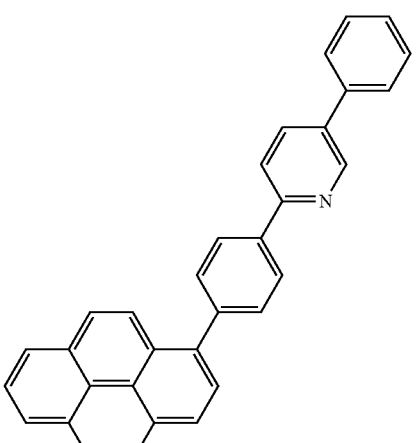
NC-11
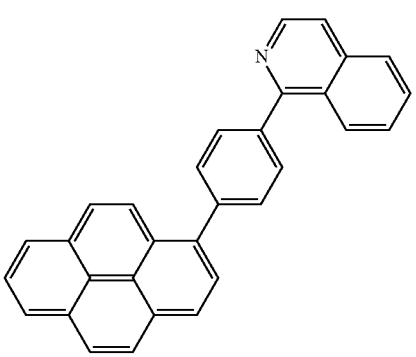
NC-12
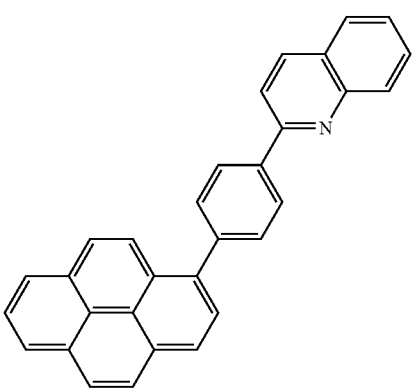
NC-13
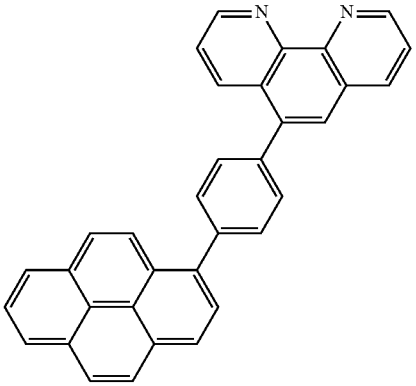

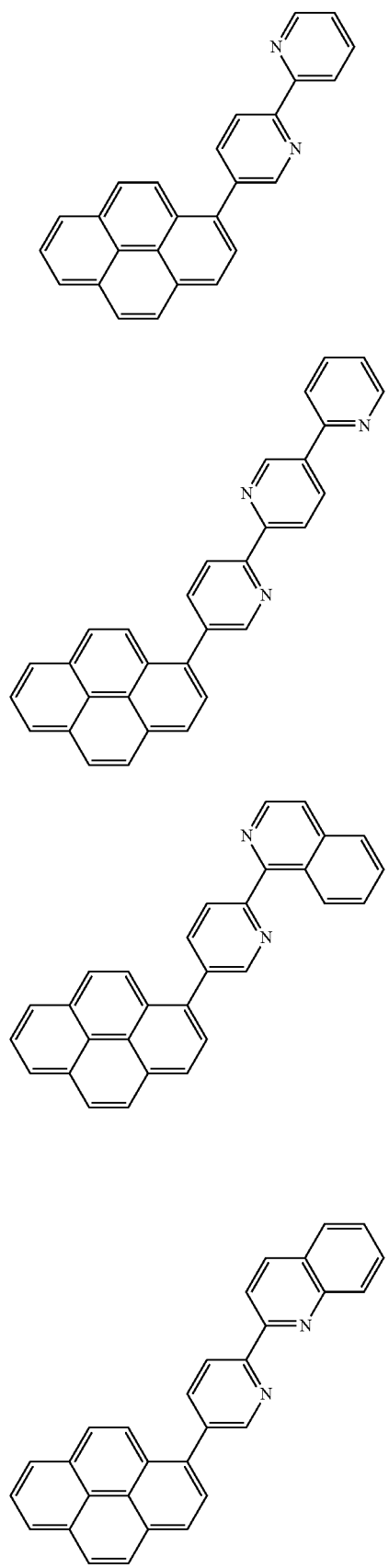
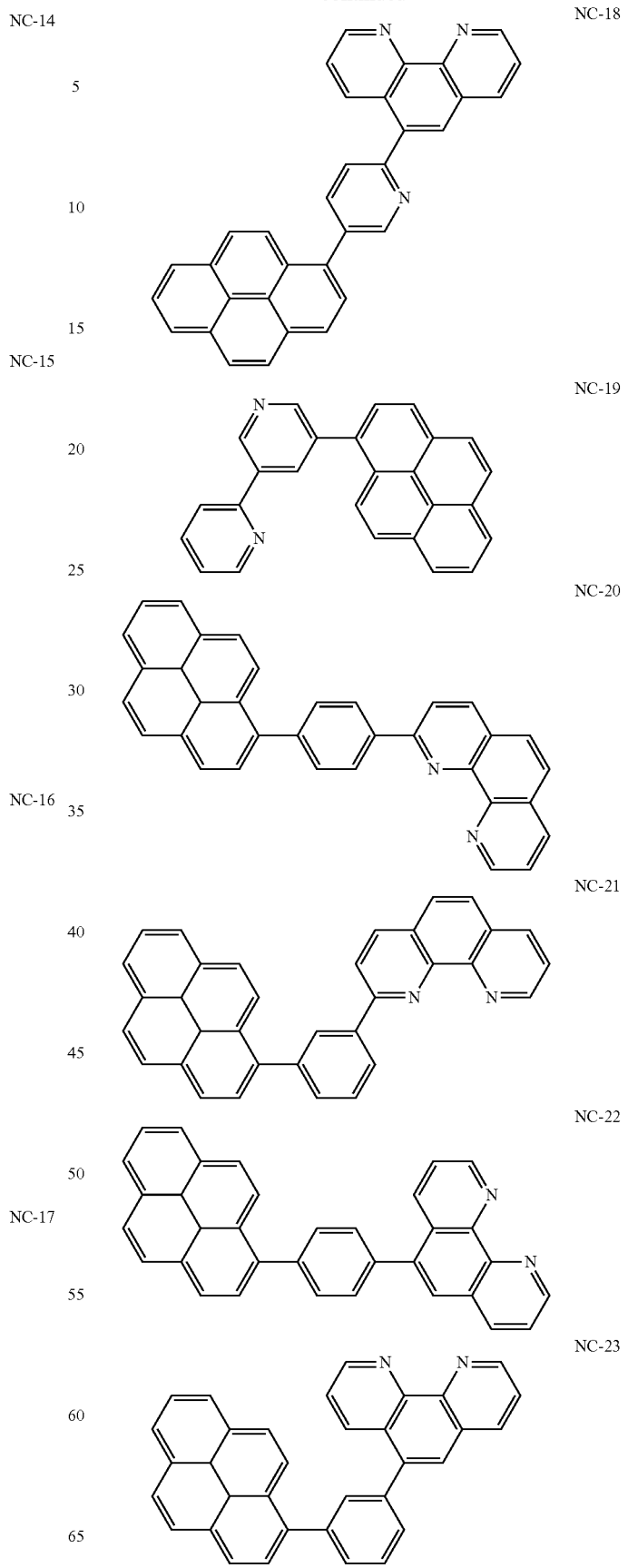

-continued
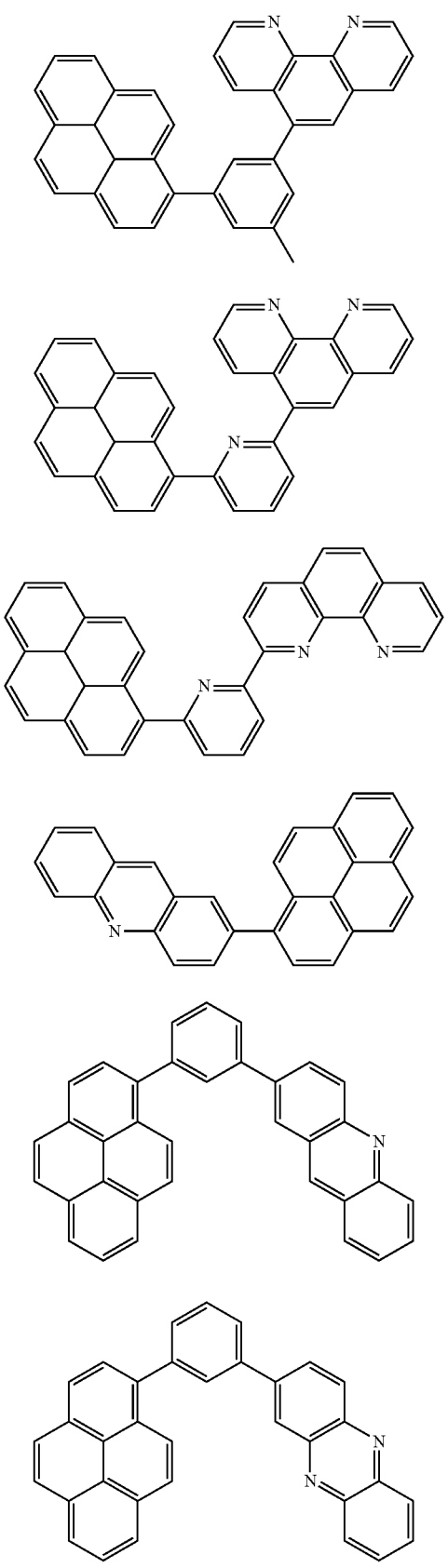
NC-24
NC-25
NC-26
NC-27
NC-28
NC-29
-continued
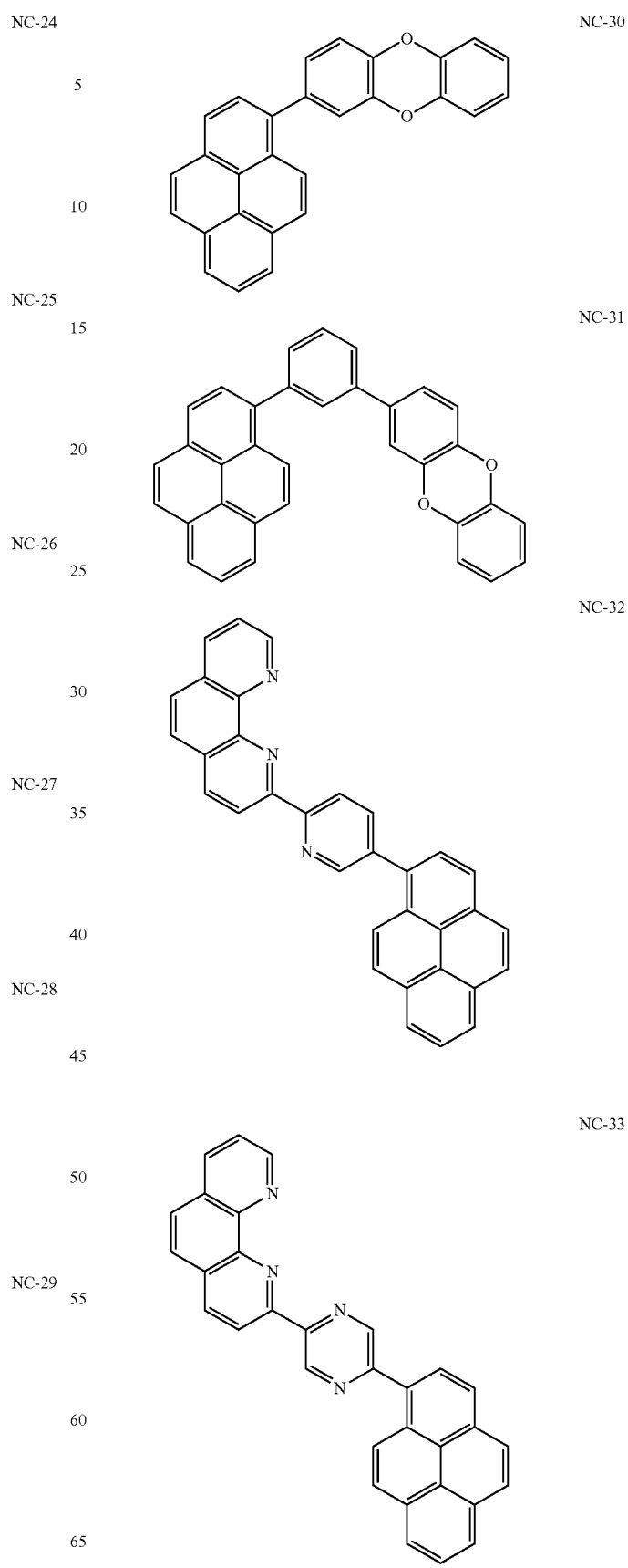
NC-30
NC-31
NC-32
NC-33

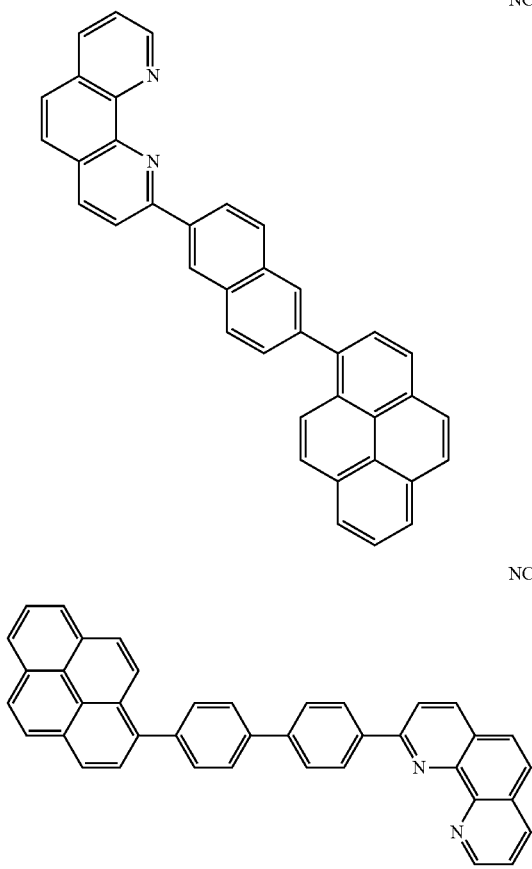
NC-34
NC-35
NC-36
NC-37
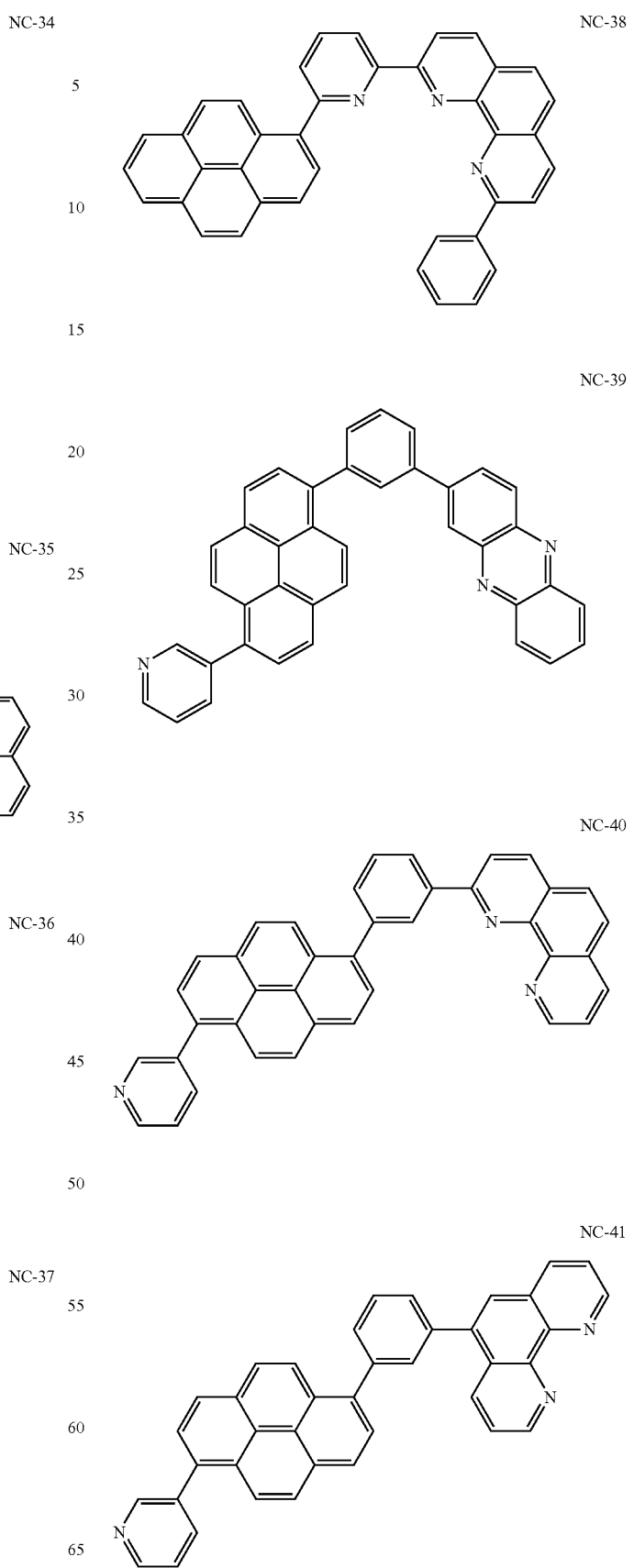
NC-38
NC-39
NC-40
NC-41

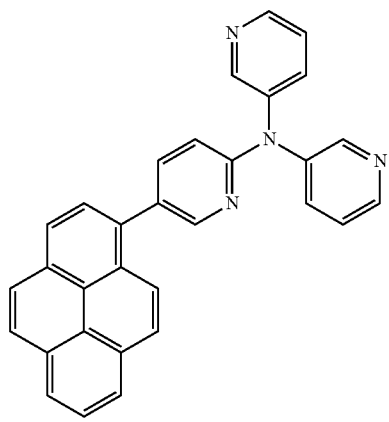

NC-42

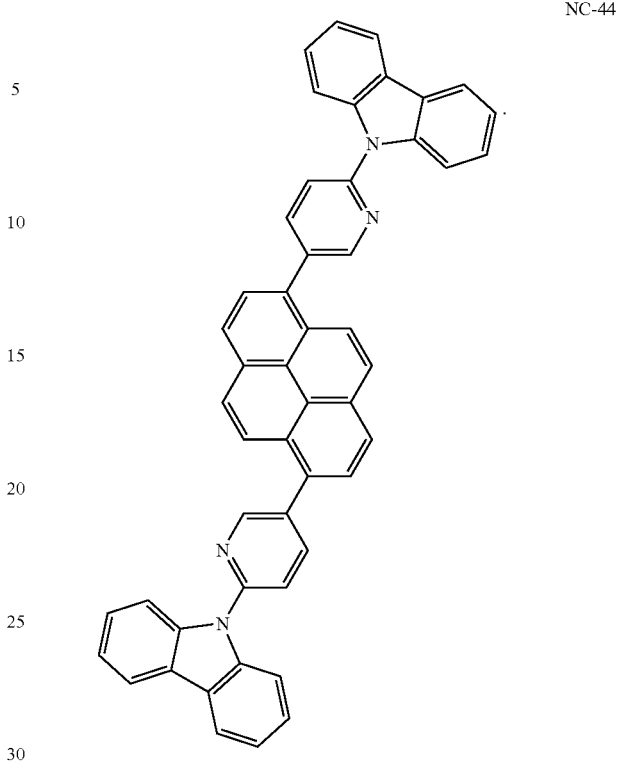

NC-44

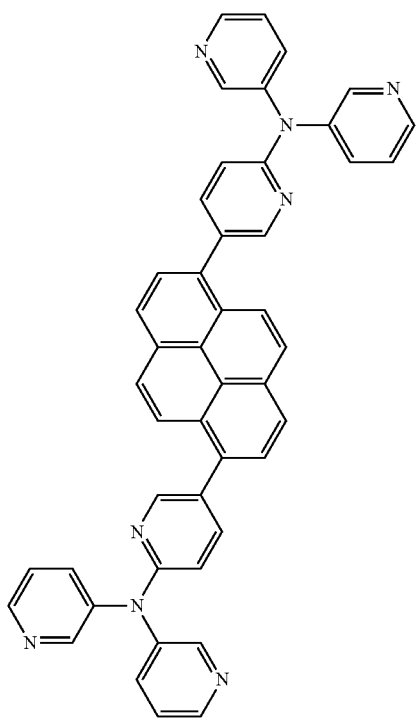

NC-43

8. The organic light emitting diode device of claim 1, wherein a substituent of the pyrene compound is at a position not parallel with the plane of the pyrene compound.

9. The organic light emitting diode device of claim 1, further comprising:
   a third light emitting part on the second light emitting part, the third light emitting part including a third light emitting layer; and
   a second charge generation layer between the second light emitting part and the third light emitting part,
   wherein the first charge generation layer or the second charge generation layer comprises at least two hosts, and at least one of the at least two hosts of the first charge generation layer or the second charge generation layer includes the pyrene compound.

10. The organic light emitting diode device of claim 9, wherein the second charge generation layer comprises an N-type charge generation layer and a P-type charge generation layer, and the N-type charge generation layer includes the pyrene compound.

11. The organic light emitting diode device of claim 10, wherein a thickness of the N-type charge generation layer is 50 to 400 Å.

12. The organic light emitting diode device of claim 9, wherein at least one of the at least two hosts of the first charge generation layer or the second charge generation layer has electron transport characteristics.

13. The organic light emitting diode device of claim 9, wherein the third light emitting layer comprises one of red, green, and blue organic light emitting layers to emit white light.

14. The organic light emitting diode device of claim 1, wherein the first light emitting layer and the second light emitting layer each comprises one of red, green, and blue organic light emitting layers to emit white light.

15. An organic light emitting diode device comprising:
at least two light emitting parts between an anode and a cathode, the at least two light emitting parts including a light emitting layer; and
charge generation layers between the at least two light emitting parts,
one of the charge generation layers comprising an N-type charge generation layer and a P-type charge generation layer, and the N-type charge generation layer includes at least two hosts and a dopant, and the at least two hosts includes different energy levels, and one of the at least two hosts includes a compound that is bonded to the dopant.

16. The organic light emitting diode device of claim 15, wherein the compound includes a pyrene and a substituent, the substituent of the compound is at a position not parallel with the plane of the pyrene to facilitate bonding to the dopant.

17. The organic light emitting diode device of claim 15, wherein at least one of the at least two hosts has electron transport characteristics.

18. The organic light emitting diode device of claim 15, wherein a thickness of the N-type charge generation layer is 50 to 400 Å.

19. The organic light emitting diode device of claim 18, wherein a thickness of an overlap portion of the at least two hosts is 10 to 200 Å.

20. The organic light emitting diode device of claim 15, wherein the compound comprises a pyrene compound indicated by the following Chemical Formula 1:

[Chemical Formula 1]

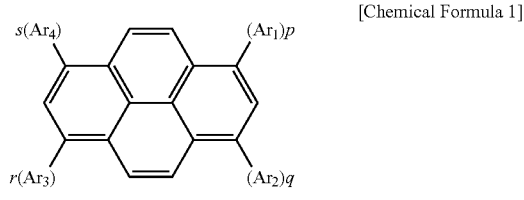

wherein each of p, q, r, and s is 0, 1 or an integer that satisfies $1 \le p+q+r+s \le 4$, and $Ar_1$, $Ar_2$, $Ar_3$, and $Ar_4$ are independently at least one among the following structures:

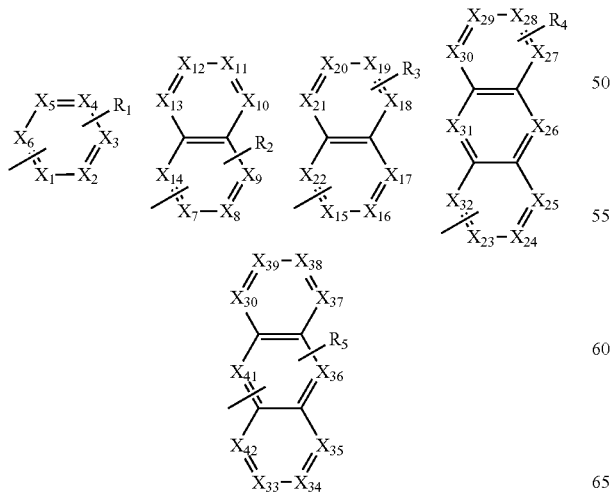

wherein at least one of $X_1$ to $X_6$, at least one of $X_7$ to $X_{14}$, at least one of $X_{15}$ to $X_{22}$, at least one of $X_{23}$ to $X_{32}$, and at least one of $X_{33}$ to $X_{42}$ comprise any one selected from among C, N, S, and O, and $R_2$, $R_3$, $R_4$, and $R_5$ are selected independently from among substituted or unsubstituted alkyl, aryl, hetero aryl, aryl amine, and hetero aryl amine compounds, and $R_1$ is at least one among H, substituted or unsubstituted alkyl, aryl, hetero aryl, aryl amine, and hetero aryl amine compounds.

21. The organic light emitting diode device of claim 20, wherein the $R_1$, $R_2$, $R_3$, $R_4$, and $R_5$ are at least one among the structures benzene, naphthalene, biphenyl, pyridine, quinoline, quinoxaline, fluorene, phenanthroline, and phenanthrene.

22. The organic light emitting diode device of claim 20, wherein the pyrene compound is at least one among following compounds:

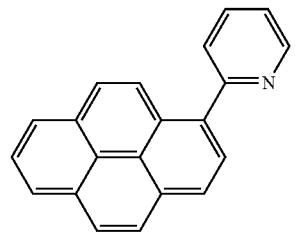

NC-01

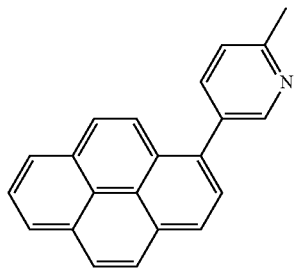

NC-02

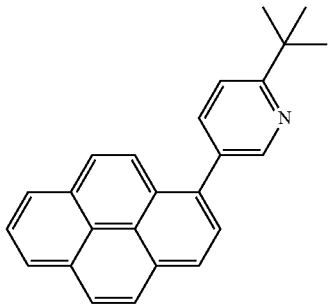

NC-03

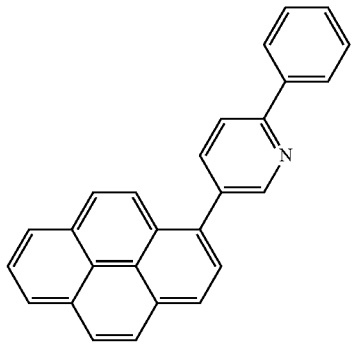

NC-04

NC-05
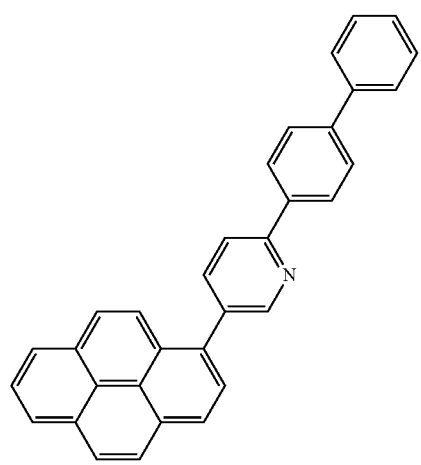
NC-06
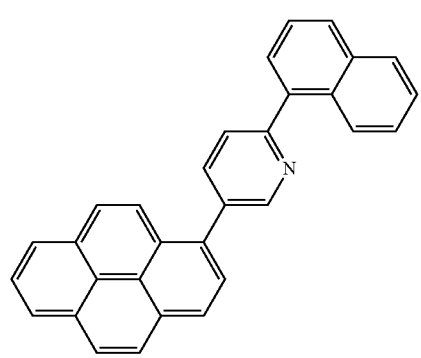
NC-07
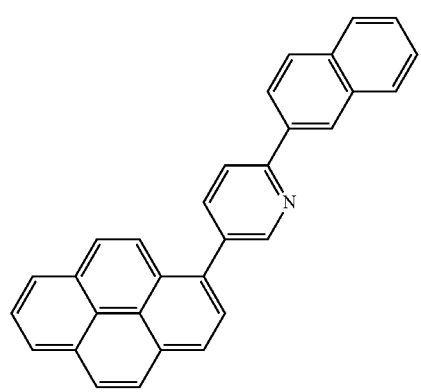
NC-08
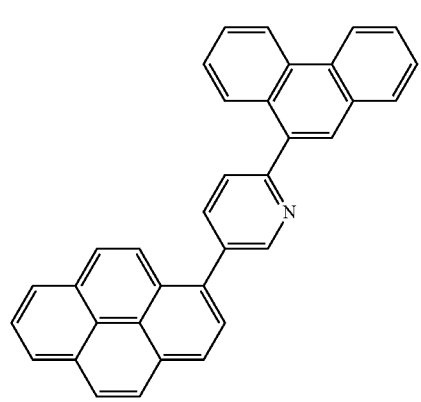
NC-09
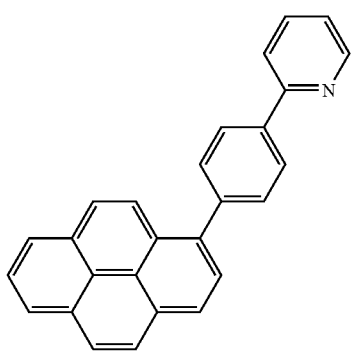
NC-10
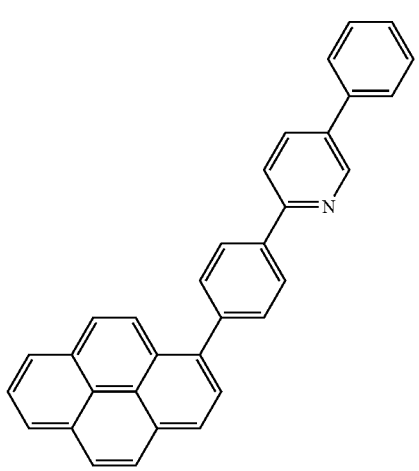
NC-11
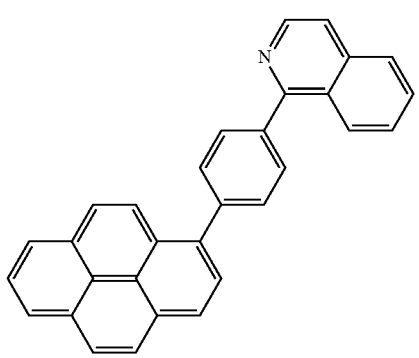
NC-12
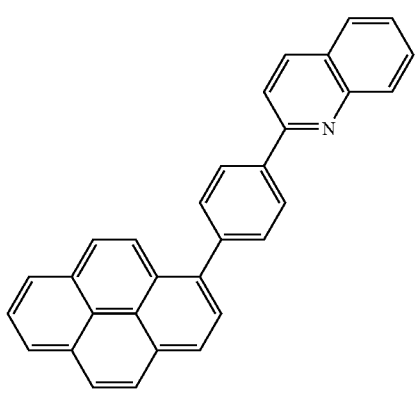

-continued
NC-13
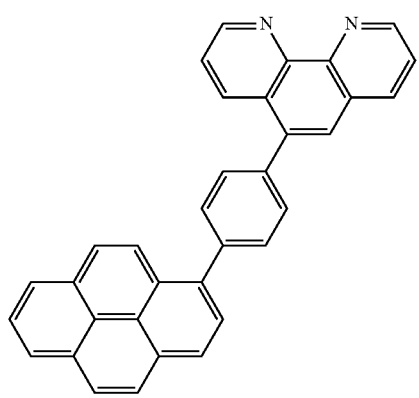
NC-14
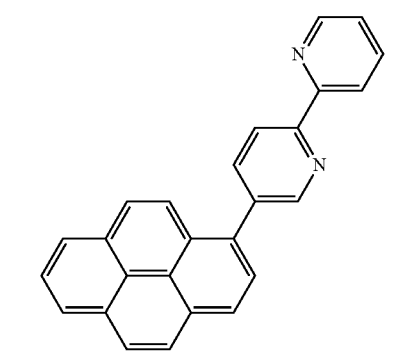
NC-15
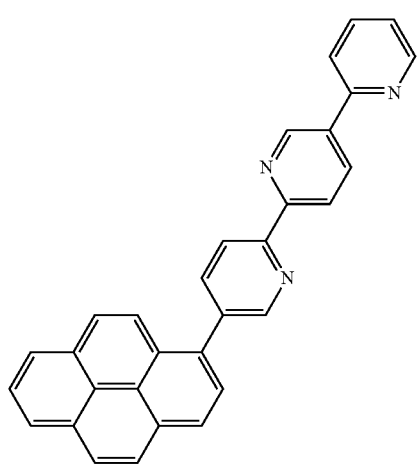
NC-16
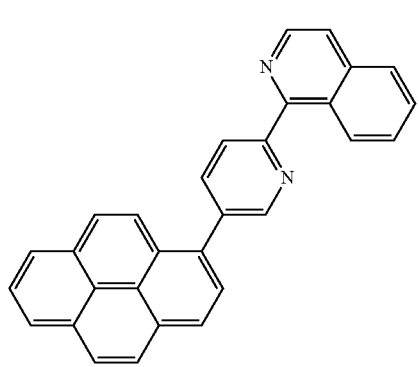
-continued
NC-17
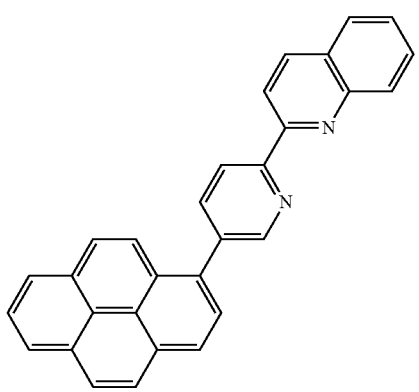
NC-18
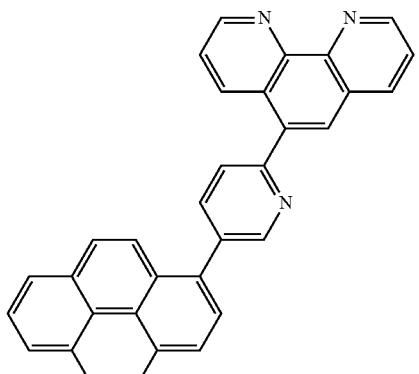
NC-19
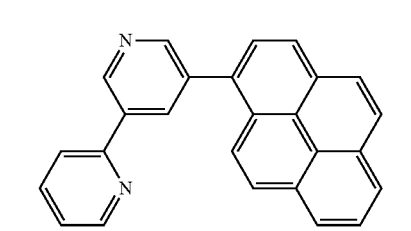
NC-20
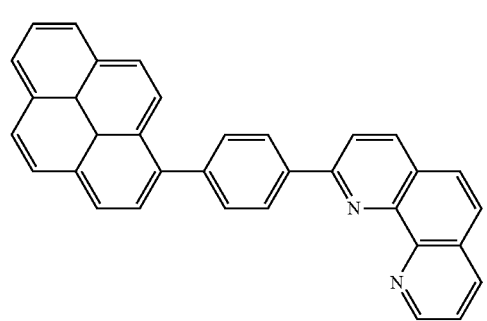
NC-21
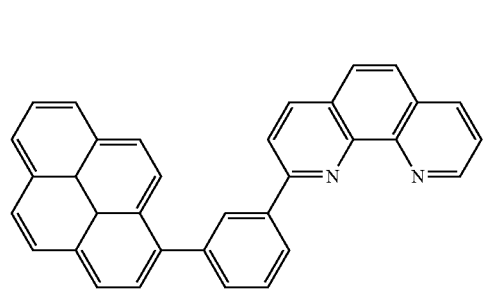

NC-22
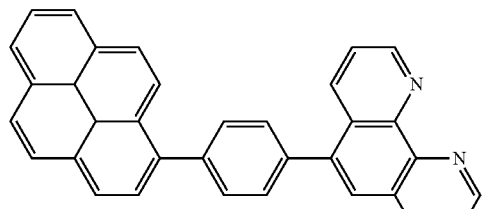
NC-23
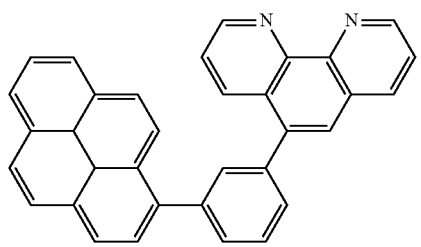
NC-24
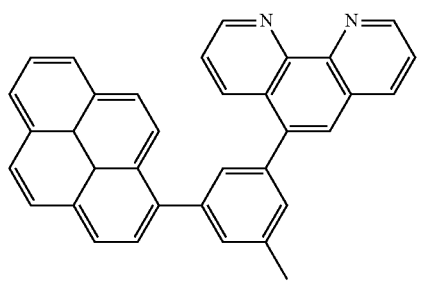
NC-25
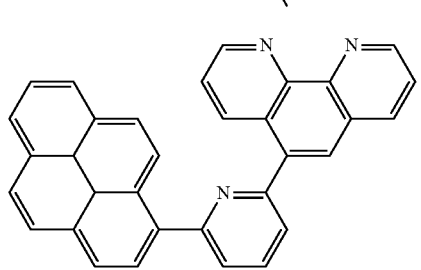
NC-26
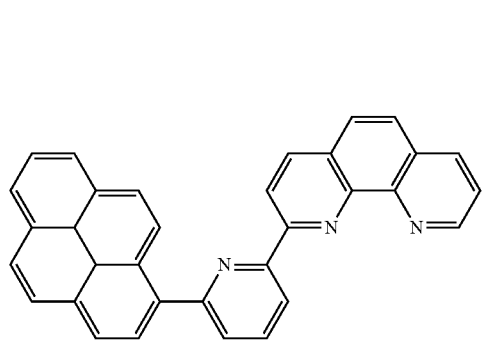
NC-27
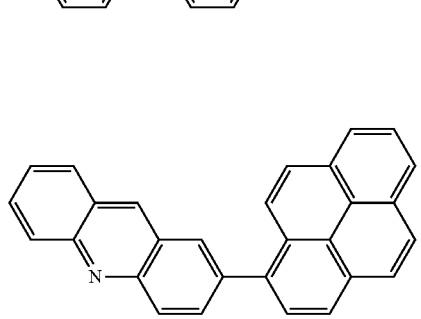
NC-28
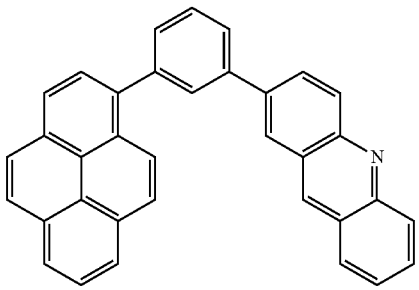
NC-29
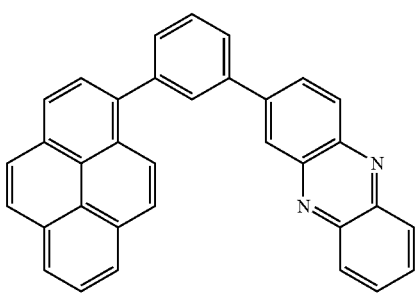
NC-30
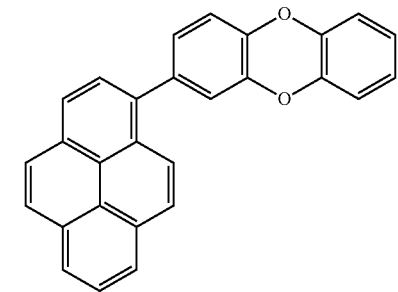
NC-31
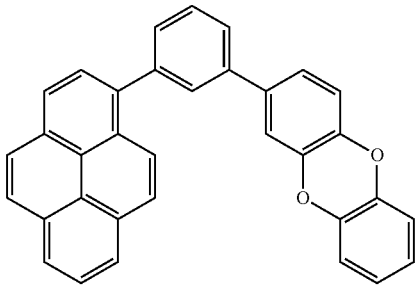

-continued
NC-32
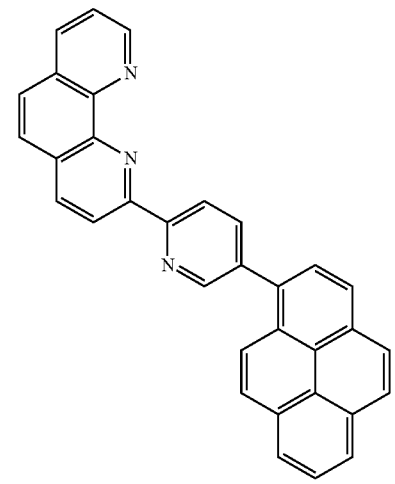
NC-33
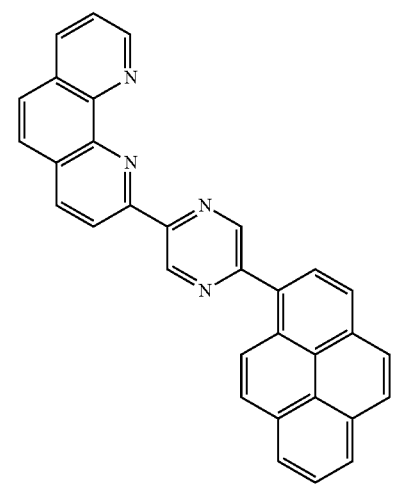
NC-34
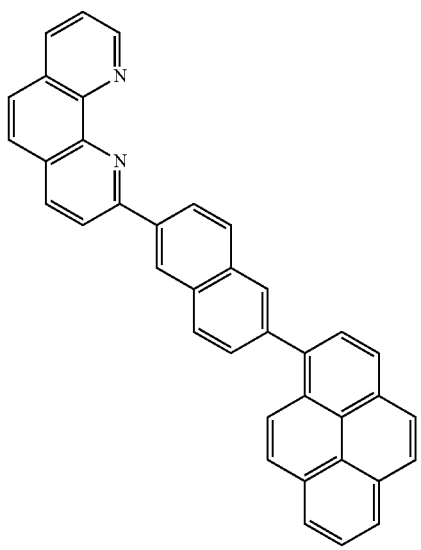
-continued
NC-35
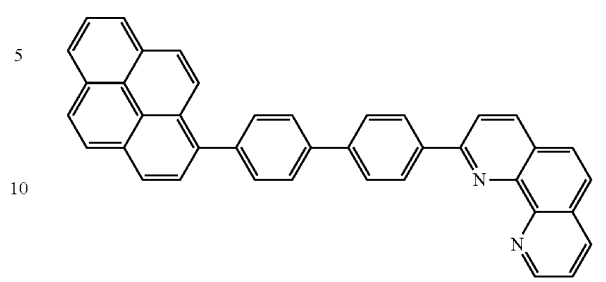
NC-36
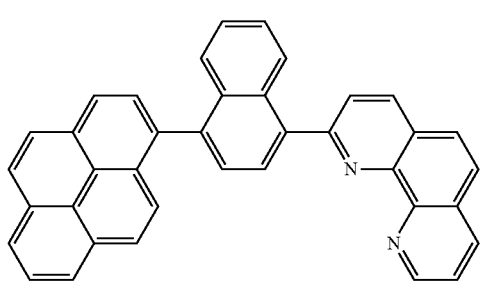
NC-37
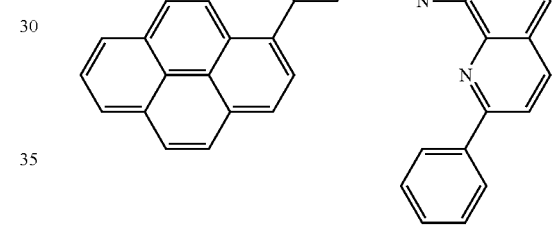
NC-38
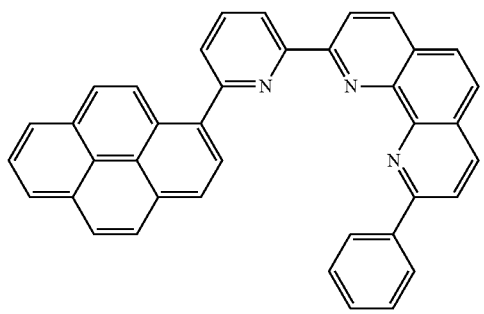
NC-39
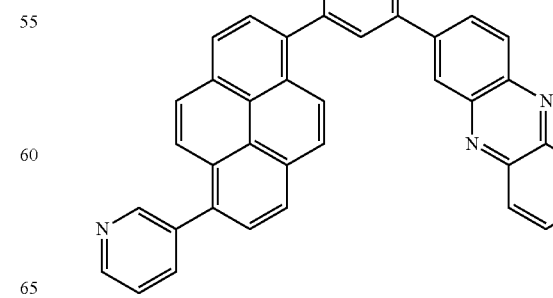

-continued
NC-40
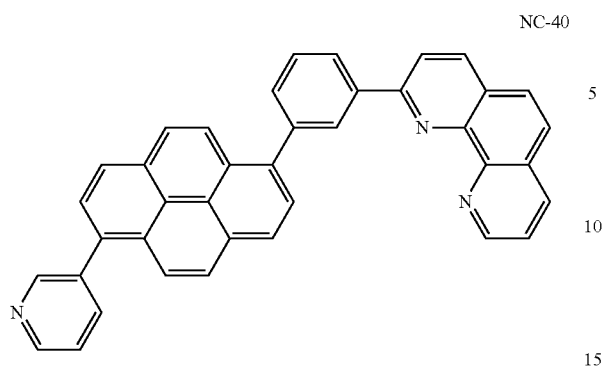
NC-41
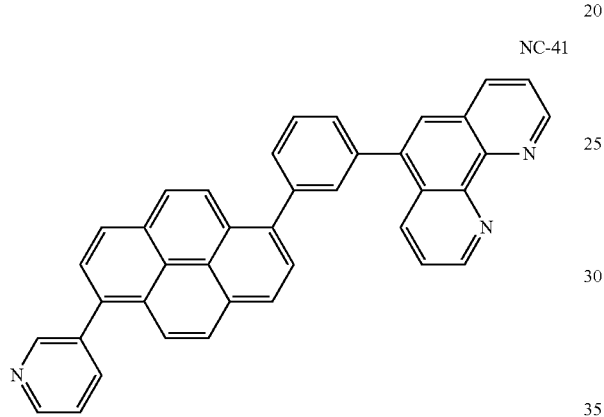
NC-42
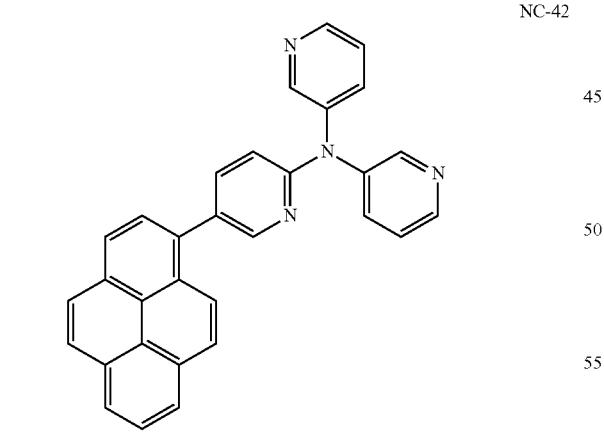
-continued
NC-43
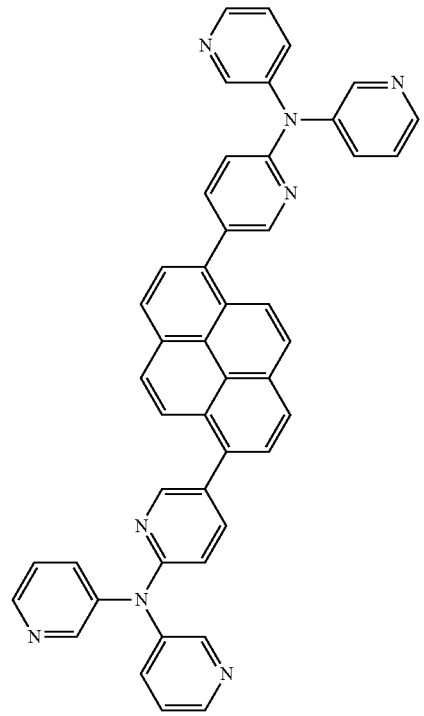
NC-44
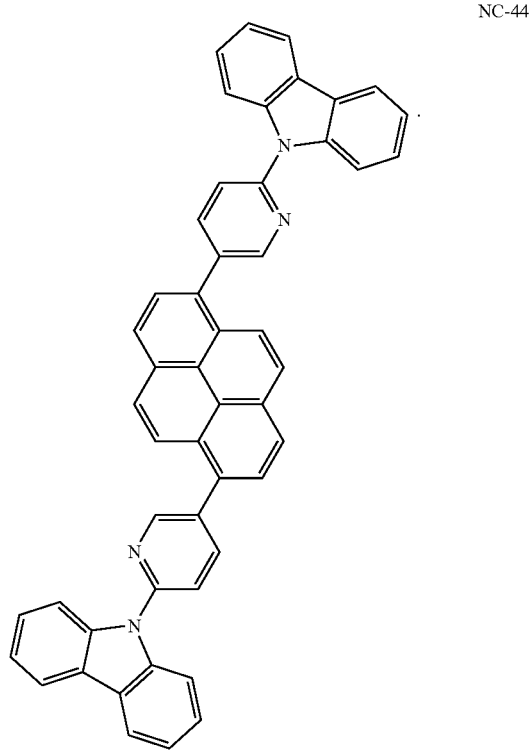 [SMILES: c1ccc2c(c1)c1ccccc1n2-c1ccc(-c2ccc3ccc4c(-c5ccc(-n6c7ccccc7c7ccccc76)nc5)ccc5ccc2c3c54)cn1]
* * * * *